US007522441B2

(12) United States Patent
Kumagai et al.

(10) Patent No.: US 7,522,441 B2
(45) Date of Patent: Apr. 21, 2009

(54) INTEGRATED CIRCUIT DEVICE AND ELECTRONIC INSTRUMENT

(75) Inventors: Takashi Kumagai, Chino (JP); Hisanobu Ishiyama, Chino (JP); Kazuhiro Maekawa, Chino (JP); Satoru Ito, Suwa (JP); Takashi Fujise, Shiojiri (JP); Junichi Karasawa, Tatsuno-machi (JP); Satoru Kodaira, Chino (JP)

(73) Assignee: Seiko Epson Corporation, Tokyo (JP)

( * ) Notice: Subject to any disclaimer, the term of this patent is extended or adjusted under 35 U.S.C. 154(b) by 554 days.

(21) Appl. No.: 11/270,553

(22) Filed: Nov. 10, 2005

(65) Prior Publication Data

US 2007/0002061 A1 Jan. 4, 2007

(30) Foreign Application Priority Data

Jun. 30, 2005 (JP) ............................ 2005-191709

(51) Int. Cl.
*G11C 5/06* (2006.01)

(52) U.S. Cl. ................ 365/63; 365/230.03; 365/230.06

(58) Field of Classification Search ............ 365/230.03, 365/63, 189.08, 230.06; 345/98
See application file for complete search history.

(56) References Cited

U.S. PATENT DOCUMENTS

| | | | |
|---|---|---|---|
| 4,566,038 | A | 1/1986 | Dimick |
| 4,648,077 | A | 3/1987 | Pinkham et al. |
| 5,040,152 | A | 8/1991 | Voss et al. |
| 5,426,603 | A | 6/1995 | Nakamura et al. |
| 5,490,114 | A | 2/1996 | Butler et al. |
| 5,598,346 | A | 1/1997 | Agrawal et al. |
| 5,659,514 | A | 8/1997 | Hazani |
| 5,739,803 | A | 4/1998 | Neugebauer |
| 5,815,136 | A | 9/1998 | Ikeda et al. |
| 5,860,084 | A | 1/1999 | Yaguchi |
| RE36,089 | E | 2/1999 | Ooishi et al. |
| 5,909,125 | A | 6/1999 | Kean |

(Continued)

FOREIGN PATENT DOCUMENTS

| | | |
|---|---|---|
| CN | 1534560 | 10/2004 |

(Continued)

OTHER PUBLICATIONS

U.S. Appl. No. 12/000,882, filed Dec. 18, 2007, Kodaira et al.

*Primary Examiner*—Anh Phung
*Assistant Examiner*—Hien N Nguyen
(74) *Attorney, Agent, or Firm*—Oliff & Berridge, PLC

(57) ABSTRACT

An integrated circuit device including first to Nth circuit blocks CB1 to CBN disposed along a first direction D1, when the first direction D1 is a direction from a first side of the integrated circuit device toward a third side which is opposite to the first side, the first side being a short side, and when a second direction D2 is a direction from a second side of the integrated circuit device toward a fourth side which is opposite to the second side, the second side being a long side. The circuit blocks CB1 to CBN include a high-speed interface circuit block HB which transfers data through a serial bus using differential signals, and a circuit block other than HB. The high-speed interface circuit block HB is disposed as an Mth circuit block CBM (2≦M≦N−1) of the circuit blocks CB1 to CBN.

20 Claims, 25 Drawing Sheets

U.S. PATENT DOCUMENTS

| | | | |
|---|---|---|---|
| 5,920,885 | A | 7/1999 | Rao |
| 5,933,364 | A | 8/1999 | Aoyama et al. |
| 6,025,822 | A | 2/2000 | Motegi et al. |
| 6,034,541 | A | 3/2000 | Kopec, Jr. et al. |
| 6,111,786 | A | 8/2000 | Nakamura |
| 6,118,425 | A | 9/2000 | Kudo et al. |
| 6,225,990 | B1 | 5/2001 | Aoki et al. |
| 6,229,336 | B1 | 5/2001 | Felton et al. |
| 6,229,753 | B1 | 5/2001 | Kono et al. |
| 6,246,386 | B1 | 6/2001 | Perner |
| 6,278,148 | B1 | 8/2001 | Watanabe et al. |
| 6,324,088 | B1 | 11/2001 | Keeth et al. |
| 6,421,286 | B1 | 7/2002 | Ohtani et al. |
| 6,559,508 | B1 | 5/2003 | Lin et al. |
| 6,580,631 | B1 | 6/2003 | Keeth et al. |
| 6,611,407 | B1 | 8/2003 | Chang |
| 6,646,283 | B1 | 11/2003 | Akimoto et al. |
| 6,724,378 | B2 | 4/2004 | Tamura et al. |
| 6,731,538 | B2 | 5/2004 | Noda et al. |
| 6,822,631 | B1 | 11/2004 | Yatabe |
| 6,826,116 | B2 | 11/2004 | Noda et al. |
| 6,862,247 | B2 | 3/2005 | Yamazaki |
| 6,873,310 | B2 | 3/2005 | Matsueda |
| 6,873,566 | B2 | 3/2005 | Choi |
| 6,999,353 | B2 | 2/2006 | Noda et al. |
| 7,078,948 | B2 | 7/2006 | Dosho |
| 7,081,879 | B2 | 7/2006 | Sun et al. |
| 7,142,221 | B2 | 11/2006 | Sakamaki et al. |
| 7,158,439 | B2 | 1/2007 | Shionori et al. |
| 7,164,415 | B2 | 1/2007 | Ooishi et al. |
| 7,176,864 | B2 | 2/2007 | Moriyama et al. |
| 7,180,495 | B1 | 2/2007 | Matsueda |
| 7,280,329 | B2 | 10/2007 | Kim et al. |
| 7,391,668 | B2 * | 6/2008 | Natori et al. ........... 365/230.03 |
| 7,411,804 | B2 * | 8/2008 | Kumagai et al. .............. 365/63 |
| 7,411,861 | B2 * | 8/2008 | Kodaira et al. ......... 365/230.06 |
| 2001/0022744 | A1 | 9/2001 | Noda et al. |
| 2002/0011998 | A1 | 1/2002 | Tamura |
| 2002/0018058 | A1 | 2/2002 | Tamura |
| 2002/0013783 | A1 | 8/2002 | Tamura et al. |
| 2002/0154557 | A1 | 10/2002 | Mizugaki et al. |
| 2003/0053022 | A1 | 3/2003 | Kaneko et al. |
| 2003/0053321 | A1 | 3/2003 | Ishiyama |
| 2003/0169244 | A1 | 9/2003 | Kurokawa et al. |
| 2004/0004877 | A1 | 1/2004 | Uetake |
| 2004/0017341 | A1 | 1/2004 | Maki |
| 2004/0021947 | A1 | 2/2004 | Schofield et al. |
| 2004/0124472 | A1 | 7/2004 | Lin et al. |
| 2004/0140970 | A1 | 7/2004 | Morita |
| 2004/0239606 | A1 | 12/2004 | Ota |
| 2005/0001846 | A1 | 1/2005 | Shiono |
| 2005/0045955 | A1 | 3/2005 | Kim et al. |
| 2005/0047266 | A1 | 3/2005 | Shionori et al. |
| 2005/0052340 | A1 | 3/2005 | Goto et al. |
| 2005/0057581 | A1 | 3/2005 | Horiuchi et al. |
| 2005/0073470 | A1 | 4/2005 | Nose et al. |
| 2005/0122303 | A1 | 6/2005 | Hashimoto |
| 2005/0195149 | A1 | 9/2005 | Ito |
| 2005/0212788 | A1 | 9/2005 | Fukuda et al. |
| 2005/0212826 | A1 | 9/2005 | Fukuda et al. |
| 2005/0219189 | A1 | 10/2005 | Fukuo |
| 2005/0253976 | A1 | 11/2005 | Sekiguchi et al. |
| 2005/0262293 | A1 | 11/2005 | Yoon |
| 2006/0062483 | A1 | 3/2006 | Kondo et al. |
| 2007/0000971 | A1 | 1/2007 | Kumagai et al. |
| 2007/0001886 | A1 | 1/2007 | Ito et al. |
| 2007/0001968 | A1 | 1/2007 | Kodaira et al. |
| 2007/0001969 | A1 | 1/2007 | Kodaira et al. |
| 2007/0001970 | A1 | 1/2007 | Kodaira et al. |
| 2007/0001971 | A1 | 1/2007 | Kumagai et al. |
| 2007/0001972 | A1 | 1/2007 | Kumagai et al. |
| 2007/0001973 | A1 | 1/2007 | Kumagai et al. |
| 2007/0001974 | A1 | 1/2007 | Kumagai et al. |
| 2007/0001975 | A1 | 1/2007 | Kumagai et al. |
| 2007/0001982 | A1 | 1/2007 | Ito et al. |
| 2007/0001983 | A1 | 1/2007 | Ito et al. |
| 2007/0001984 | A1 | 1/2007 | Kumagai et al. |
| 2007/0002062 | A1 | 1/2007 | Kodaira et al. |
| 2007/0002063 | A1 | 1/2007 | Kumagai et al. |
| 2007/0002188 | A1 | 1/2007 | Kumagai et al. |
| 2007/0002509 | A1 | 1/2007 | Kumagai et al. |
| 2007/0002667 | A1 | 1/2007 | Kodaira et al. |
| 2007/0002669 | A1 | 1/2007 | Kodaira et al. |
| 2007/0002670 | A1 | 1/2007 | Kodaira et al. |
| 2007/0002671 | A1 | 1/2007 | Kumagai et al. |
| 2007/0013074 | A1 | 1/2007 | Kodaira et al. |
| 2007/0013634 | A1 | 1/2007 | Saiki et al. |
| 2007/0013635 | A1 | 1/2007 | Ito et al. |
| 2007/0013684 | A1 | 1/2007 | Kodaira et al. |
| 2007/0013685 | A1 | 1/2007 | Kodaira et al. |
| 2007/0013687 | A1 | 1/2007 | Kodaira et al. |
| 2007/0013706 | A1 | 1/2007 | Kodaira et al. |
| 2007/0013707 | A1 | 1/2007 | Kodaira et al. |
| 2007/0016700 | A1 | 1/2007 | Kodaira et al. |
| 2007/0035503 | A1 | 2/2007 | Kurokawa et al. |
| 2007/0187762 | A1 | 8/2007 | Saiki et al. |

FOREIGN PATENT DOCUMENTS

| | | |
|---|---|---|
| CN | 1542964 | 11/2004 |
| EP | 0 499 478 A2 | 8/1992 |
| JP | A 63-225993 | 9/1988 |
| JP | A 1-171190 | 7/1989 |
| JP | A 4-370595 | 12/1992 |
| JP | A 5-181154 | 7/1993 |
| JP | A 7-281634 | 10/1995 |
| JP | A 8-69696 | 3/1996 |
| JP | A 11-261011 | 9/1999 |
| JP | A 11-274424 | 10/1999 |
| JP | A 11-330393 | 11/1999 |
| JP | A-2001-067868 | 3/2001 |
| JP | A 2001-222249 | 8/2001 |
| JP | A 2001-222276 | 8/2001 |
| JP | A 2002-244624 | 8/2002 |
| JP | A-2002-358777 | 12/2002 |
| JP | A 2003-022063 | 1/2003 |
| JP | A 2003-330433 | 11/2003 |
| JP | A 2004-040042 | 2/2004 |
| JP | A 2004-146806 | 5/2004 |
| JP | A 2004-159314 | 6/2004 |
| JP | A 2004-328456 | 11/2004 |
| JP | A-2005-17725 | 1/2005 |
| JP | A 2005-72607 | 3/2005 |
| KR | A 1992-17106 | 9/1992 |
| KR | 1999-88197 | 12/1999 |
| KR | A 2001-100814 | 11/2001 |
| KR | A-10-2005-0011743 | 1/2005 |
| TW | 1224300 | 3/2003 |
| TW | 563081 | 11/2003 |

* cited by examiner

FIG. 4

| | WITH MEMORY (RAM) | | WITHOUT MEMORY | | CSTN | TFD |
|---|---|---|---|---|---|---|
| | AMORPHOUS TFT | LOW-TEMPERATURE POLYSILICON TFT | AMORPHOUS TFT | LOW-TEMPERATURE POLYSILICON TFT | | |
| MEMORY (RAM) | INCLUDE | INCLUDE | NOT INCLUDE | NOT INCLUDE | INCLUDE | INCLUDE |
| DATA DRIVER | INCLUDE | INCLUDE | INCLUDE | INCLUDE | INCLUDE | INCLUDE |
| SCAN DRIVER | INCLUDE | NOT INCLUDE | INCLUDE | NOT INCLUDE | INCLUDE | INCLUDE |
| LOGIC CIRCUIT (G/A) | INCLUDE | INCLUDE | INCLUDE | INCLUDE | INCLUDE | INCLUDE |
| GRAYSCALE VOLTAGE GENERATION CIRCUIT ($\gamma$) | INCLUDE | INCLUDE | INCLUDE | INCLUDE | NOT INCLUDE | NOT INCLUDE |
| POWER SUPPLY CIRCUIT | INCLUDE | INCLUDE | INCLUDE | INCLUDE | INCLUDE | INCLUDE |

AMPLITUDE ADJUSTMENT

INCLINATION ADJUSTMENT

FINE ADJUSTMENT

LD
HIGH-SPEED I/F CIRCUIT HB
12
14
10
W
CB1 TO CBN
SP=LD/W>10
D1
D2
D3
D4

W1
WB
W2
OUTPUT-SIDE I/F REGION
12
CB1 TO CBN
INPUT-SIDE I/F REGION
14
PAD
PAD
W
W1+WB+W2≦W<W1+2×WB+W2

W1
WB
W2
0.13≦W1≦0.4
0.65≦WB≦1.2
0.1≦W2≦0.2
OUTPUT-SIDE I/F REGION
12
CB1 TO CBN
INPUT-SIDE I/F REGION
14
PAD
PAD
W
WB>W1+W2
W<2×WB

INTEGRATED CIRCUIT DEVICE AND ELECTRONIC INSTRUMENT

Japanese Patent Application No. 2005-191709, filed on Jun. 30, 2005, is hereby incorporated by reference in its entirety.

BACKGROUND OF THE INVENTION

The present invention relates to an integrated circuit device and an electronic instrument.

In recent years, a high-speed serial transfer interface such as low voltage differential signaling (LVDS) has attracted attention as an interface aiming at reducing EMI noise or the like. In such a high-speed serial transfer, a transmitter circuit transmits serialized data by using differential signals, and a receiver circuit differentially amplifies the differential signals to realize data transfer (JP-A-2001-222249).

A portable telephone generally includes a first instrument section provided with buttons for inputting a telephone number or characters, a second instrument section provided with a display panel or a camera, and a connection section such as a hinge which connects the first and second instrument sections. Therefore, the number of interconnects passing through the connection section can be reduced by transferring data between a first substrate provided in the first instrument section and a second substrate provided in the second instrument section by serial transfer using differential signals.

A display driver (LCD driver) is an integrated circuit device which drives a display panel such as a liquid crystal panel. In order to realize the high-speed serial transfer between the first and second instrument sections, a high-speed interface circuit which transfers data through a serial bus must be incorporated in the display driver.

However, when mounting the integrated circuit device as the display driver by using a chip-on-glass (COG) technology, the high-speed serial transfer signal quality deteriorates due to contact resistance of a bump as an external connection terminal.

A reduction in chip size is required for the display driver in order to reduce cost. However, the size of the display panel incorporated in a portable telephone or the like is almost constant. Therefore, if the chip size is reduced by merely shrinking the integrated circuit device as the display driver by using a microfabrication technology, it becomes difficult to mount the integrated circuit device.

SUMMARY

According to a first aspect of the invention, there is provided an integrated circuit device, comprising:

first to Nth circuit blocks (N is an integer larger than one) disposed along a first direction, when the first direction is a direction from a first side of the integrated circuit device toward a third side which is opposite to the first side, the first side being a short side, and when a second direction is a direction from a second side of the integrated circuit device toward a fourth side which is opposite to the second side, the second side being a long side, wherein the first to Nth circuit blocks include a high-speed interface circuit block which transfers data through a serial bus using differential signals, and a circuit block other than the high-speed interface circuit block; and wherein the high-speed interface circuit block is disposed as an Mth circuit block ($2 \leqq M \leqq N-1$) of the first to Nth circuit blocks.

According to a second aspect of the invention, there is provided an electronic instrument, comprising:

the above-described integrated circuit device; and a display panel driven by the integrated circuit device.

BRIEF DESCRIPTION OF THE SEVERAL VIEWS OF THE DRAWING

FIG. 4 is an example of various types of display drivers and circuit blocks provided in the display drivers.

DETAILED DESCRIPTION OF THE EMBODIMENT

Figure 1A:
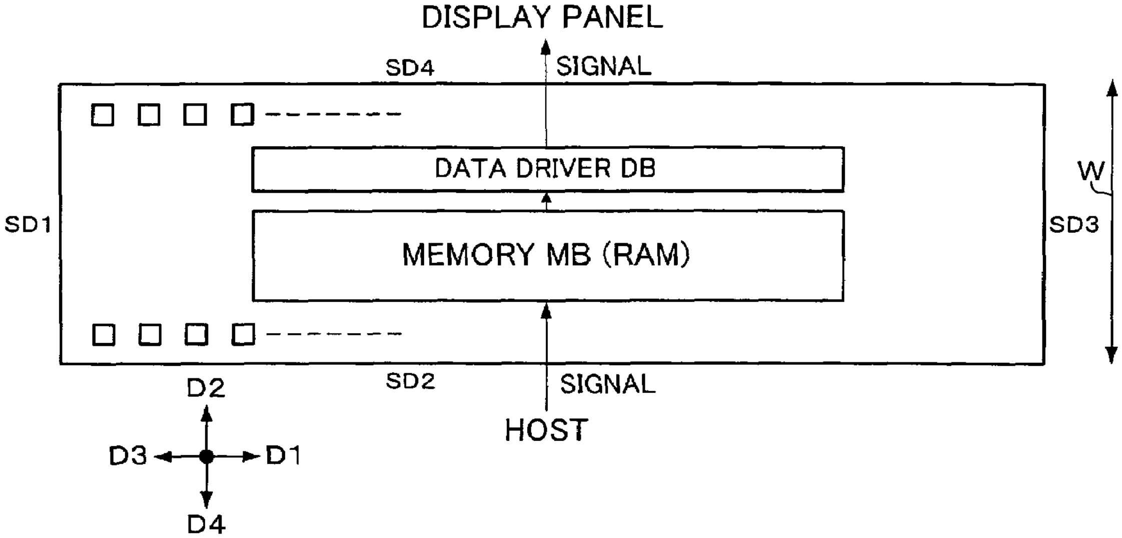
FIGS. 1A to 1C show an integrated circuit device as a comparative example of one embodiment of the invention.

The invention may provide an integrated circuit device which can maintain the high-speed serial transfer signal quality, and an electronic instrument including the same.

According to one embodiment of the invention, there is provided an integrated circuit device, comprising:

first to Nth circuit blocks (N is an integer larger than one) disposed along a first direction, when the first direction is a direction from a first side of the integrated circuit device toward a third side which is opposite to the first side, the first side being a short side, and when a second direction is a direction from a second side of the integrated circuit device toward a fourth side which is opposite to the second side, the second side being a long side, wherein the first to Nth circuit blocks include a high-speed interface circuit block which transfers data through a serial bus using differential signals, and a circuit block other than the high-speed interface circuit block; and wherein the high-speed interface circuit block is disposed as an Mth circuit block ($2 \leqq M \leqq N-1$) of the first to Nth circuit blocks.

In the embodiment, the first to Nth circuit blocks are disposed along the first direction, and include the high-speed interface circuit block and a circuit block other than the high-speed interface circuit block. The high-speed interface circuit block is disposed as the Mth circuit block of the first to Nth circuit blocks excluding the circuit blocks on each end. Therefore, an impedance mismatch due to the contact resistance of an external connection terminal (e.g. bump) can be reduced, whereby the high-speed serial transfer signal quality can be maintained.

In this integrated circuit device, the value M may satisfy $[N/2]-2 \leqq M \leqq [N/2]+3$ ([X] is maximum integer which does not exceed X).

This allows the high-speed interface circuit block to be disposed near the center of the integrated circuit device, whereby an impedance mismatch due to the contact resistance of the external connection terminal can be further reduced.

In this integrated circuit device, the Mth circuit block may include the high-speed interface circuit block and another circuit block.

This makes it possible to implement an efficient layout.

In this integrated circuit device, the other circuit block of the Mth circuit block may be a logic circuit block which generates a display control signal.

This enables the high-speed interface circuit block and the logic circuit block to be connected through a signal line along a short path, whereby the layout efficiency can be increased.

In this integrated circuit device, the first to Nth circuit blocks may include a grayscale voltage generation circuit block which generates grayscale voltages; and the Mth circuit block including the logic circuit block and the high-speed interface circuit block may be disposed adjacent to the grayscale voltage generation circuit block along the first direction.

This enables the high-speed interface circuit block and the logic circuit block to be connected through a signal line along a short path and enables the grayscale voltage generation circuit block and the logic circuit block to be connected through a signal line along a short path, whereby the layout efficiency can be increased.

In this integrated circuit device, the first to Nth circuit blocks may include at least one data driver block which receives the grayscale voltages from the grayscale voltage generation circuit block and drives data lines; and the grayscale voltage generation circuit block may be disposed between the Mth circuit block including the logic circuit block and the high-speed interface circuit block, and the data driver block.

This enables adjustment data signal lines and grayscale voltage output lines to be efficiently disposed, whereby the interconnect efficiency can be increased.

In this integrated circuit device, the other circuit block of the Mth circuit block may be a grayscale voltage generation circuit block which generates grayscale voltages.

This enables a power supply interconnect or the like to be used in common by the high-speed interface circuit block and the grayscale voltage generation circuit block, whereby the layout efficiency can be increased.

In this integrated circuit device, the first to Nth circuit blocks may include a logic circuit block which generates a display control signal and sets grayscale characteristic adjustment data; and the Mth circuit block including the grayscale voltage generation circuit block and the high-speed interface circuit block may be disposed adjacent to the logic circuit block along the first direction.

This enables the high-speed interface circuit block and the logic circuit block to be connected through a signal line along a short path and enables the grayscale voltage generation circuit block and the logic circuit block to be connected through a signal line along a short path, whereby the layout efficiency can be increased.

In this integrated circuit device, the first to Nth circuit blocks may include at least one data driver block which receives the grayscale voltages from the grayscale voltage generation circuit block and drives data lines; and the Mth circuit block including the grayscale voltage generation circuit block and the high-speed interface circuit block may be disposed between the logic circuit block and the data driver block.

This enables the adjustment data signal lines and the grayscale voltage output lines to be efficiently disposed, whereby the interconnect efficiency can be increased.

The integrated circuit device may comprise:

a first interface region provided along the fourth side and on the second direction side of the first to Nth circuit blocks; and a second interface region provided along the second side and on a fourth direction side of the first to Nth circuit blocks, the fourth direction being opposite to the second direction.

In this integrated circuit device, the high-speed interface circuit block may be disposed adjacently on the second direction side of the second interface region.

This enables a pad or the like disposed in the second interface region and the high-speed interface circuit block to be connected along a short path, whereby the interconnect efficiency can be increased.

In this integrated circuit device, when a width of the integrated circuit device in the second direction is denoted by W and a length of the integrated circuit device in the first direction is denoted by LD, a shape ratio SP of the integrated circuit device may satisfy $SP=LD/W$ and $SP>10$.

This realizes a slim integrated circuit device, so that facilitation of mounting and a reduction in cost of the device can be achieved in combination.

In this integrated circuit device, when widths of the first interface region, the first to Nth circuit blocks, and the second interface region in the second direction are respectively denoted by W1, WB, and W2, a width W of the integrated circuit device in the second direction may satisfy $W1+WB+W2 \leqq W < W1+2\times WB+W2$.

According to the integrated circuit device in which such a relational expression is satisfied, the width in the second direction can be reduced while securing the width of the circuit block in the second direction (without causing the layout of the circuit block to become flat to a large extent), whereby a slim integrated circuit device can be provided. This enables facilitation of mounting and a reduction in cost of the device. Moreover, since the circuit block has an appropriate width, the layout design is facilitated, whereby the device development period can be reduced.

In this integrated circuit device, the width W of the integrated circuit device in the second direction may satisfy $W<2\times WB$.

This enables the width of the integrated circuit device in the second direction to be reduced while sufficiently securing the width of the first to Nth circuit blocks in the second direction.

According to one embodiment of the invention, there is provided an electronic instrument, comprising:

the above-described integrated circuit device; and a display panel driven by the integrated circuit device.

These embodiments of the invention will be described in detail below, with reference to the drawings. Note that the embodiments described below do not in any way limit the scope of the invention laid out in the claims herein. In addition, not all of the elements of the embodiments described below should be taken as essential requirements of the invention.

1. Comparative Example

FIG. 1A shows an integrated circuit device 500 which is a comparative example of one embodiment of the invention. The integrated circuit device 500 shown in FIG. 1A includes a memory block MB (display data RAM) and a data driver block DB. The memory block MB and the data driver block DB are disposed along a direction D2. The memory block MB and the data driver block DB are ultra-flat blocks of which the length along a direction D1 is longer than the width in the direction D2.

Image data supplied from a host is written into the memory block MB. The data driver block DB converts the digital image data written into the memory block MB into an analog data voltage, and drives data lines of a display panel. In FIG. 1A, the image data signal flows in the direction D2. Therefore, in the comparative example shown in FIG. 1A, the memory block MB and the data driver block DB are disposed along the direction D2 corresponding to the signal flow. This reduces the path between the input and the output so that a signal delay can be optimized, whereby an efficient signal transmission can be achieved.

However, the comparative example shown in FIG. 1A has the following problems.

Figure 2A:
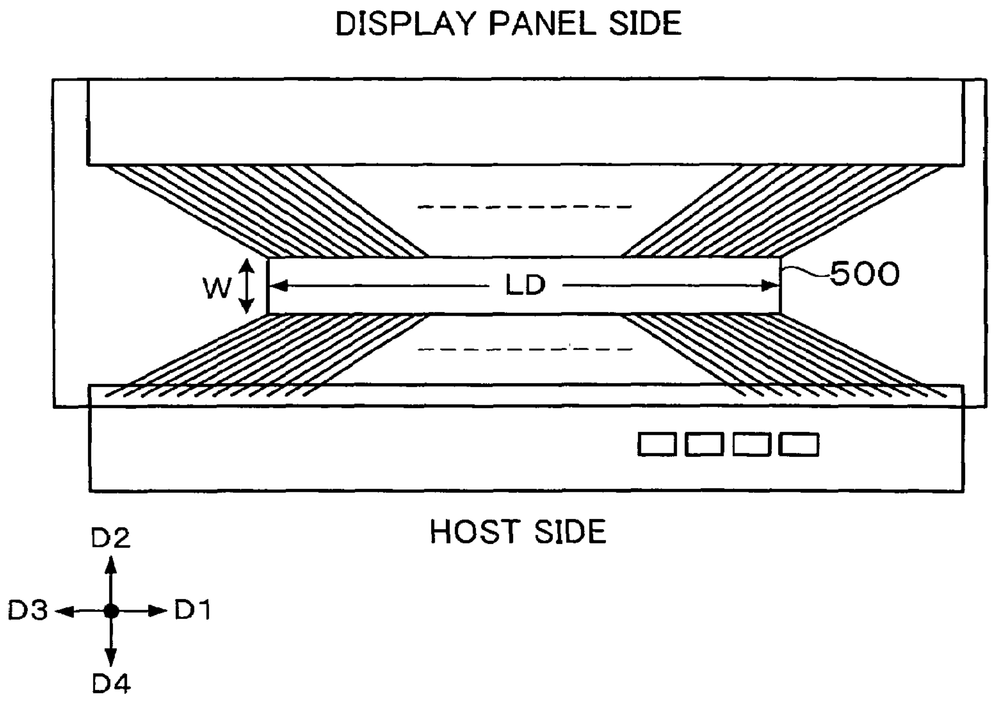
FIGS. 2A and 2B are diagrams illustrative of mounting an integrated circuit device.

First, a reduction in the chip size is required for an integrated circuit device such as a display driver in order to reduce cost. However, if the chip size is reduced by merely shrinking the integrated circuit device 500 by using a microfabrication technology, the size of the integrated circuit device 500 is reduced not only in the short side direction but also in the long side direction. Therefore, it becomes difficult to mount the integrated circuit device 500 as shown in FIG. 2A. Specifically, it is desirable that the output pitch be 22 μm or more, for example. However, the output pitch is reduced to 17 μm by merely shrinking the integrated circuit device 500 as shown in FIG. 2A, for example, whereby it becomes difficult to mount the integrated circuit device 500 due to the narrow pitch. Moreover, the number of glass substrates obtained is decreased due to an increase in the glass frame of the display panel, whereby cost is increased.

Figure 1B:
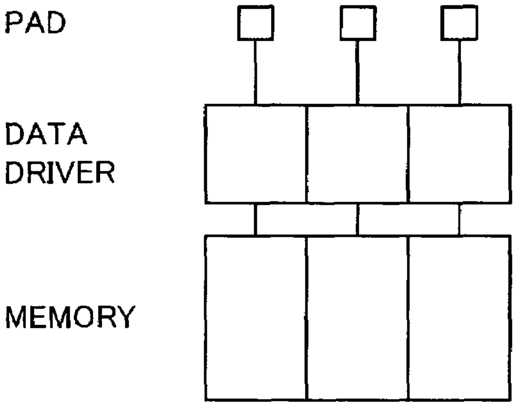
Figure 1C:
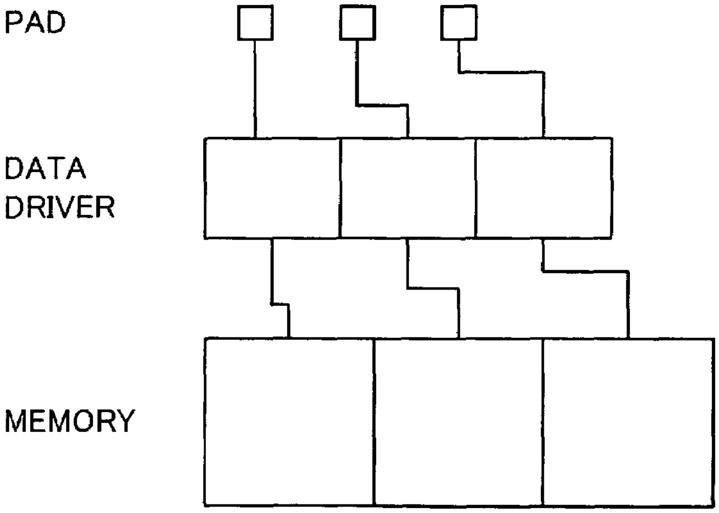

Second, the configurations of the memory and the data driver of the display driver are changed corresponding to the type of display panel (amorphous TFT or low-temperature polysilicon TFT), the number of pixels (QCIF, QVGA, or VGA), the specification of the product, and the like. Therefore, in the comparative example shown in FIG. 1A, even if the pad pitch, the cell pitch of the memory, and the cell pitch of the data driver coincide in one product as shown in FIG. 1B, the pitches do not coincide as shown in FIG. 1C when the configurations of the memory and the data driver are changed. If the pitches do not coincide as shown in FIG. 1C, an unnecessary interconnect region for absorbing the pitch difference must be formed between the circuit blocks. In particular, in the comparative example shown in FIG. 1A in which the block is made flat in the direction D1, the area of an unnecessary interconnect region for absorbing the pitch difference is increased. As a result, the width W of the integrated circuit device 500 in the direction D2 is increased, whereby cost is increased due to an increase in the chip area.

If the layout of the memory and the data driver is changed so that the pad pitch coincides with the cell pitch in order to avoid such a problem, the development period is increased, whereby cost is increased. Specifically, since the circuit configuration and the layout of each circuit block are individually designed and the pitch is adjusted thereafter in the comparative example shown in FIG. 1A, unnecessary area is provided or the design becomes inefficient.

2. Configuration of Integrated Circuit Device

Figure 3:
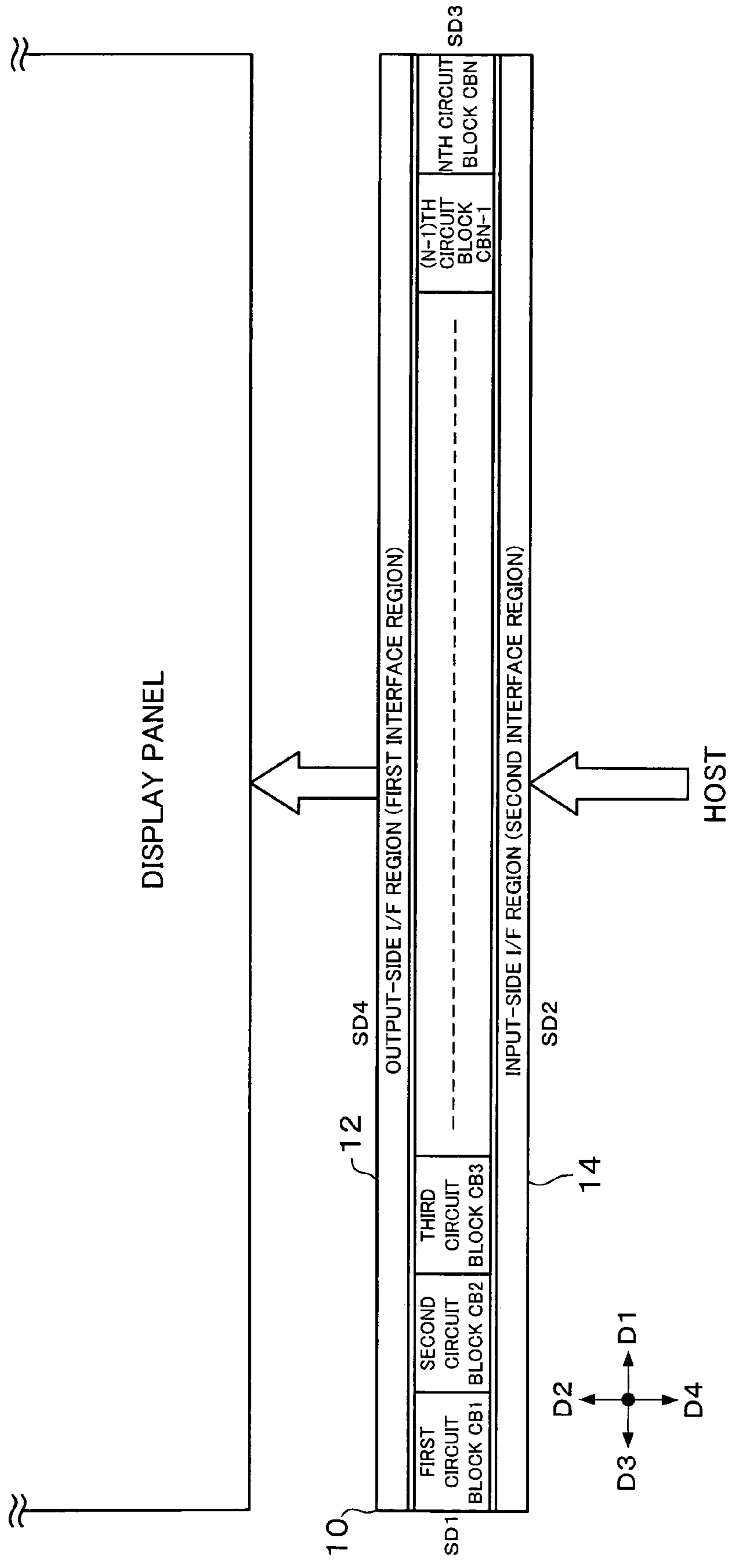
FIG. 3 is a configuration example of an integrated circuit device according to one embodiment of the invention.

FIG. 3 shows a configuration example of an integrated circuit device 10 of one embodiment of the invention which can solve the above-described problems. In the embodiment, the direction from a first side SD1 (short side) of the integrated circuit device 10 toward a third side SD3 opposite to the first side SD1 is defined as a first direction D1, and the direction opposite to the first direction D1 is defined as a third direction D3. The direction from a second side SD2 (long side) of the integrated circuit device 10 toward a fourth side SD4 opposite to the second side SD2 is defined as a second direction D2, and the direction opposite to the second direction D2 is defined as a fourth direction D4. In FIG. 3, the left side of the integrated circuit device 10 is the first side SD1, and the right side is the third side SD3. However, the left side may be the third side SD3, and the right side may be the first side SD1.

As shown in FIG. 3, the integrated circuit device 10 of the embodiment includes first to Nth circuit blocks CB1 to CBN (N is an integer larger than one) disposed along the direction D1. Specifically, while the circuit blocks are arranged in the direction D2 in the comparative example shown in FIG. 1A, the circuit blocks CB1 to CBN are arranged in the direction D1 in the embodiment. Each circuit block is a relatively square block differing from the ultra-flat block as in the comparative example shown in FIG. 1A.

The integrated circuit device 10 includes an output-side I/F region 12 (first interface region in a broad sense) provided along the side SD4 and on the D2 side of the first to Nth circuit blocks CB1 to CBN. The integrated circuit device 10 includes an input-side I/F region 14 (second interface region in a broad sense) provided along the side SD2 and on the D4 side of the first to Nth circuit blocks CB1 to CBN. In more detail, the output-side I/F region 12 (first I/O region) is disposed on the D2 side of the circuit blocks CB1 to CBN without other circuit blocks interposed therebetween, for example. The input-side I/F region 14 (second I/O region) is disposed on the D4 side of the circuit blocks CB1 to CBN without other circuit blocks interposed therebetween, for example. Specifically, only one circuit block (data driver block) exists in the direction D2 at least in the area in which the data driver block exists. When the integrated circuit device 10 is used as an intellectual property (IP) core and incorporated in another integrated circuit device, the integrated circuit device 10 may be configured to exclude at least one of the I/F regions 12 and 14.

The output-side (display panel side) I/F region 12 is a region which serves as an interface between the integrated circuit device 10 and the display panel, and includes pads and various elements such as output transistors and protective elements connected with the pads. In more detail, the output-side I/F region 12 includes output transistors for outputting data signals to data lines and scan signals to scan lines, for example. When the display panel is a touch panel, the output-side I/F region 12 may include input transistors.

The input-side I/F region 14 is a region which serves as an interface between the integrated circuit device 10 and a host (MPU, image processing controller, or baseband engine), and may include pads and various elements connected with the pads, such as input (input-output) transistors, output transistors, and protective elements. In more detail, the input-side I/F region 14 includes input transistors for inputting signals (digital signals) from the host, output transistors for outputting signals to the host, and the like.

An output-side or input-side I/F region may be provided along the short side SD1 or SD3. Bumps which serve as external connection terminals may be provided in the I/F (interface) regions 12 and 14, or may be provided in other regions (first to Nth circuit blocks CB1 to CBN). When providing the bumps in the region other than the I/F regions 12 and 14, the bumps are formed by using a small bump technology (e.g. bump technology using resin core) other than a gold bump technology.

The first to Nth circuit blocks CB1 to CBN may include at least two (or three) different circuit blocks (circuit blocks having different functions). Taking an example in which the integrated circuit device 10 is a display driver, the circuit blocks CB1 to CBN may include at least two of a data driver block, a memory block, a scan driver block, a logic circuit block, a grayscale voltage generation circuit block, and a power supply circuit block. In more detail, the circuit blocks CB1 to CBN may include at least a data driver block and a logic circuit block, and may further include a grayscale voltage generation circuit block. When the integrated circuit device 10 includes a built-in memory, the circuit blocks CB1 to CBN may further include a memory block.

FIG. 4 shows an example of various types of display drivers and circuit blocks provided in the display drivers. In an amorphous thin film transistor (TFT) panel display driver including a built-in memory (RAM), the circuit blocks CB1 to CBN include a memory block, a data driver (source driver) block, a scan driver (gate driver) block, a logic circuit (gate array circuit) block, a grayscale voltage generation circuit (γ-correction circuit) block, and a power supply circuit block. In a low-temperature polysilicon (LTPS) TFT panel display driver including a built-in memory, since the scan driver can be formed on a glass substrate, the scan driver block may be omitted. The memory block may be omitted in an amorphous TFT panel display driver which does not include a memory, and the memory block and the scan driver block may be omitted in a low-temperature polysilicon TFT panel display driver which does not include a memory. In a color super twisted nematic (CSTN) panel display driver and a thin film diode (TFD) panel display driver, the grayscale voltage generation circuit block may be omitted.

Figure 5A:
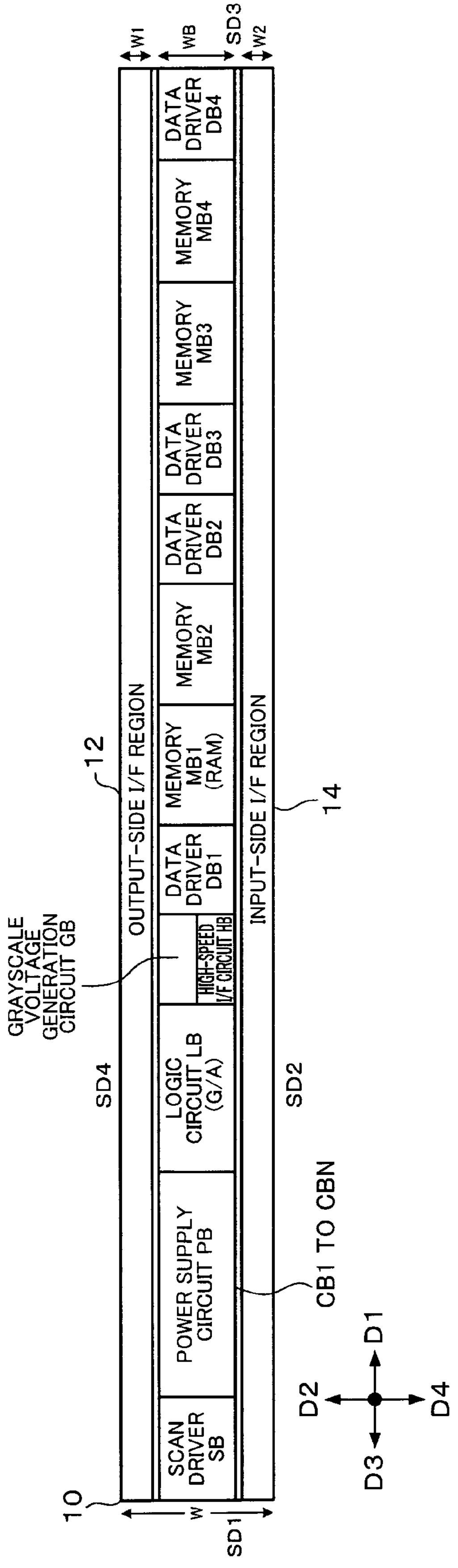
FIGS. 5A and 5B are planar layout examples of the integrated circuit device of the embodiment.
Figure 5B:
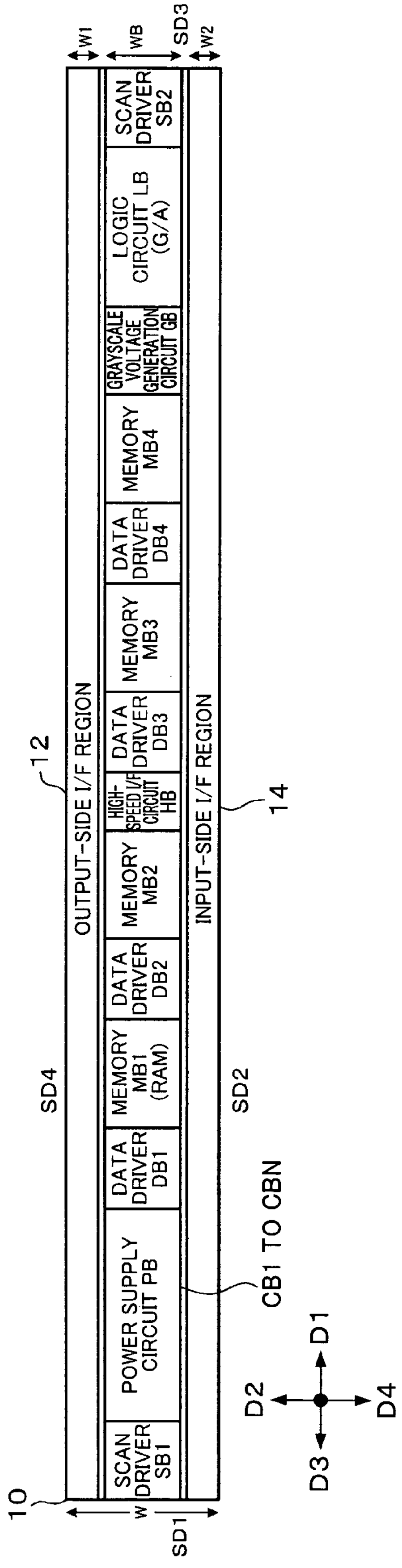

FIGS. 5A and 5B show examples of a planar layout of the integrated circuit device 10 as the display driver of the embodiment. FIGS. 5A and 5B are examples of an amorphous TFT panel display driver including a built-in memory. FIG. 5A shows a QCIF and 32-grayscale display driver, and FIG. 5B shows a QVGA and 64-grayscale display driver.

In FIGS. 5A and 5B, the first to Nth circuit blocks CB1 to CBN include first to fourth memory blocks MB1 to MB4 (first to Ith memory blocks in a broad sense; I is an integer larger than one). The first to Nth circuit blocks CB1 to CBN include first to fourth data driver blocks DB1 to DB4 (first to Ith data driver blocks in a broad sense) respectively disposed adjacent to the first to fourth memory blocks MB1 to MB4 along the direction D1. In more detail, the memory block MB1 and the data driver block DB1 are disposed adjacent to each other along the direction D1, and the memory block MB2 and the data driver block DB2 are disposed adjacent to each other along the direction D1. The memory block MB1 adjacent to the data driver block DB1 stores image data (display data) used by the data driver block DB1 to drive the data line, and the memory block MB2 adjacent to the data driver block DB2 stores image data used by the data driver block DB2 to drive the data line.

In FIG. 5A, the data driver block DB1 (Jth data driver block in a broad sense; $1 \leqq J < I$) of the data driver blocks DB1 to DB4 is disposed adjacently on the D3 side of the memory block MB1 (Jth memory block in a broad sense) of the memory blocks MB1 to MB4. The memory block MB2 ((J+1)th memory block in a broad sense) is disposed adjacently on the D1 side of the memory block MB1. The data driver block DB2 ((J+1)th data driver block in a broad sense) is disposed adjacently on the D1 side of the memory block MB2. The arrangement of the memory blocks MB3 and MB4 and the data driver blocks DB3 and DB4 is the same as described above. In FIG. 5A, the memory block MB1 and the data driver block DB1 and the memory block MB2 and the data driver block DB2 are disposed line-symmetrical with respect to the borderline between the memory blocks MB1 and MB2, and the memory block MB3 and the data driver block DB3 and the memory block MB4 and the data driver block DB4 are disposed line-symmetrical with respect to the borderline between the memory blocks MB3 and MB4. In FIG. 5A, the data driver blocks DB2 and DB3 are disposed adjacent to each other. However, another circuit block may be disposed between the data driver blocks DB2 and DB3.

In FIG. 5B, the data driver block DB1 (Jth data driver block) of the data driver blocks DB1 to DB4 is disposed adjacently on the D3 side of the memory block MB1 (Jth memory block) of the memory blocks MB1 to MB4. The data driver block DB2 ((J+1)th data driver block) is disposed on the D1 side of the memory block MB1. The memory block MB2 ((J+1)th memory block) is disposed on the D1 side of the data driver block DB2. The data driver block DB3, the memory block MB3, the data driver block DB4, and the memory block MB4 are disposed in the same manner as described above. In FIG. 5B, the memory block MB1 and the data driver block DB2, and the memory block MB3 and the data driver block DB4 are respectively disposed adjacent to each other. However, another circuit block may be disposed between these blocks.

The layout arrangement shown in FIG. 5A has an advantage in that a column address decoder can be used in common between the memory blocks MB1 and MB2 or the memory blocks MB3 and MB4 (between the Jth and (J+1)th memory blocks). The layout arrangement shown in FIG. 5B has an advantage in that the interconnect pitch of the data signal output lines from the data driver blocks DB1 to DB4 to the output-side I/F region 12 can be equalized so that the interconnect efficiency can be increased.

The layout arrangement of the integrated circuit device 10 of the embodiment is not limited to those shown in FIGS. 5A and 5B. For example, the number of memory blocks and data driver blocks may be set at 2, 3, or 5 or more, or the memory block and the data driver block may not be divided into blocks. A modification in which the memory block is not disposed adjacent to the data driver block is also possible. A configuration is also possible in which the memory block, the scan driver block, the power supply circuit block, or the grayscale voltage generation circuit block is not provided. A circuit block having a width significantly small in the direction D2 (narrow circuit block having a width less than the width WB) may be provided between the circuit blocks CB1 to CBN and the output-side I/F region 12 or the input-side I/F region 14. The circuit blocks CB1 to CBN may include a circuit block in which different circuit blocks are arranged in stages in the direction D2. For example, the scan driver circuit and the power supply circuit may be formed in one circuit block.

Figure 6A:
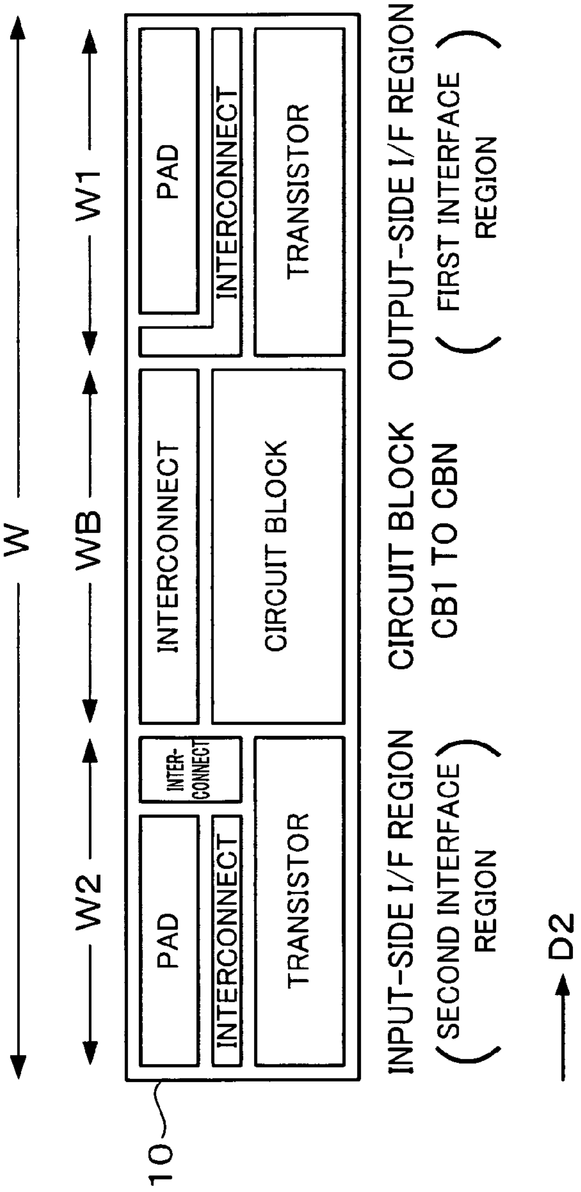
FIGS. 6A and 6B are examples of a cross-sectional diagram of the integrated circuit device.

FIG. 6A shows an example of a cross-sectional diagram of the integrated circuit device 10 of the embodiment along the direction D2. W1, WB, and W2 respectively indicate the widths of the output-side I/F region 12, the circuit blocks CB1 to CBN, and the input-side I/F region 14 in the direction D2. The widths W1, WB, and W2 indicate the widths (maximum widths) of transistor formation regions (bulk regions or active regions) of the output-side I/F region 12, the circuit blocks CB1 to CBN, and the input-side I/F region 14, respectively, and exclude bump formation regions. W indicates the width of the integrated circuit device 10 in the direction D2. In the embodiment, as shown in FIG. 6A, another circuit block is not provided between the circuit blocks CB1 to CBN and the output-side and input-side I/F regions 12 and 14. Therefore, the width W may be set at "$W1+WB+W2 \leqq W < W1+2\times WB+W2$". Or, since "$W1+W2<WB$" is satisfied, the width W may be set at "$W<2\times WB$".

Figure 6B:
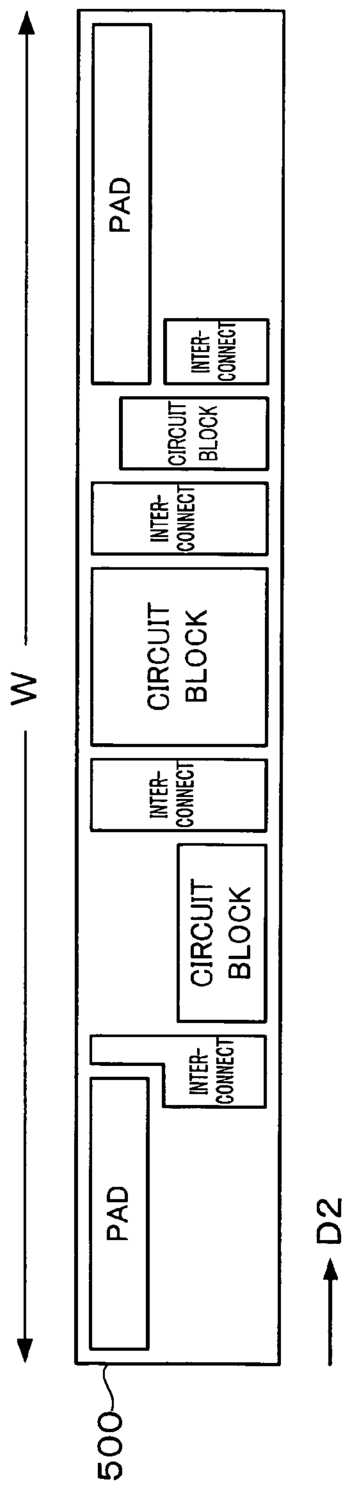

In the comparative example shown in FIG. 1A, two or more circuit blocks are disposed along the direction D2 as shown in FIG. 6B. Moreover, interconnect regions are formed between the circuit blocks and between the circuit blocks and the I/F region in the direction D2. Therefore, since the width W of the integrated circuit device 500 in the direction D2 (short side direction) is increased, a slim chip cannot be realized. Therefore, even if the chip is shrunk by using a macrofabrication technology, the length LD in the direction D1 (long side direction) is decreased, as shown in FIG. 2A, so that the output pitch becomes narrow, whereby it becomes difficult to mount the integrated circuit device 500.

Figure 2B:
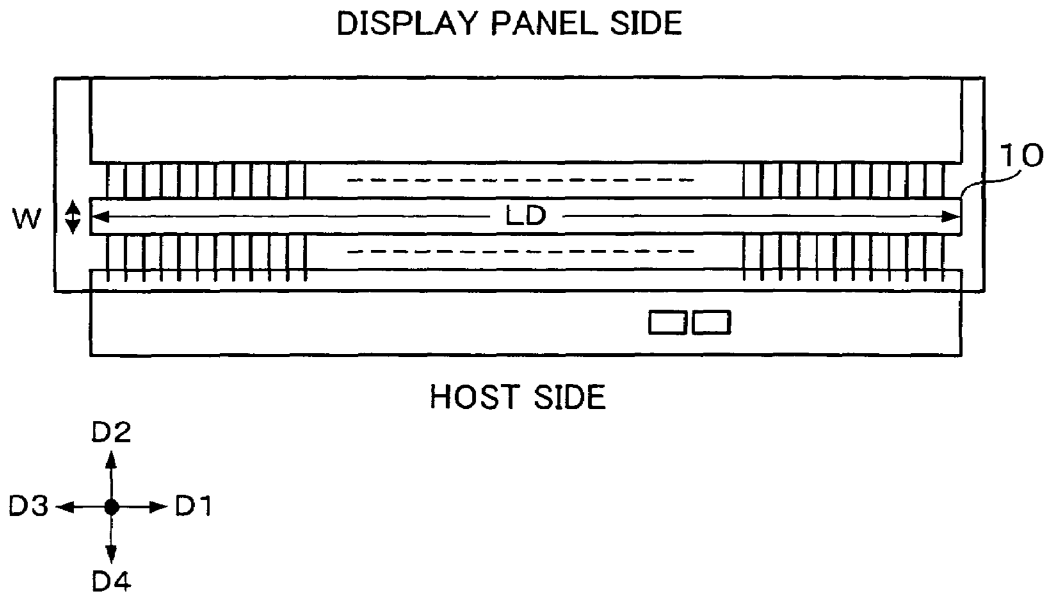

In the embodiment, the circuit blocks CB1 to CBN are disposed along the direction D1 as shown in FIGS. 3, 5A, and 5B. As shown in FIG. 6A, the transistor (circuit element) can be disposed under the pad (bump) (active surface bump). Moreover, the signal lines can be formed between the circuit blocks and between the circuit blocks and the I/F by using the global interconnects formed in the upper layer (lower layer of the pad) of the local interconnects in the circuit blocks. Therefore, since the width W of the integrated circuit device 10 in the direction D2 can be reduced while maintaining the length LD of the integrated circuit device 10 in the direction D1 as shown in FIG. 2B, a very slim chip can be realized. As a result, since the output pitch can be maintained at 22 μm or more, for example, mounting can be facilitated.

In the embodiment, since the circuit blocks CB1 to CBN are disposed along the direction D1, it is possible to easily deal with a change in the product specifications and the like. Specifically, since product of various specifications can be designed by using a common platform, the design efficiency can be increased. For example, when the number of pixels or the number of grayscales of the display panel is increased or decreased in FIGS. 5A and 5B, it is possible to deal with such a situation merely by increasing or decreasing the number of blocks of memory blocks or data driver blocks, the number of readings of image data in one horizontal scan period, or the like. FIGS. 5A and 5B show an example of an amorphous TFT panel display driver including a memory. When developing a low-temperature polysilicon TFT panel product including a memory, it suffices to remove the scan driver block from the circuit blocks CB1 to CBN. When developing a product which does not include a memory, it suffices to remove the memory block from the circuit blocks CB1 to CBN. In the embodiment, even if the circuit block is removed corresponding to the specification, since the effect on the remaining circuit blocks is minimized, the design efficiency can be increased.

In the embodiment, the widths (heights) of the circuit blocks CB1 to CBN in the direction D2 can be uniformly adjusted to the width (height) of the data driver block or the memory block, for example. Since it is possible to deal with an increase or decrease in the number of transistors of each circuit block by increasing or decreasing the length of each circuit block in the direction D1, the design efficiency can be further increased. For example, when the number of transistors is increased or decreased in FIGS. 5A and 5B due to a change in the configuration of the grayscale voltage generation circuit block or the power supply circuit block, it is possible to deal with such a situation by increasing or decreasing the length of the grayscale voltage generation circuit block or the power supply circuit block in the direction D1.

As a second comparative example, a narrow data driver block may be disposed in the direction D1, and other circuit blocks such as the memory block may be disposed along the direction D1 on the D4 side of the data driver block, for example. However, in the second comparative example, since the data driver block having a large width lies between other circuit blocks such as the memory block and the output-side I/F region, the width W of the integrated circuit device in the direction D2 is increased, so that it is difficult to realize a slim chip. Moreover, an additional interconnect region is formed between the data driver block and the memory block, whereby the width W is further increased. Furthermore, when the configuration of the data driver block or the memory block is changed, the pitch difference described with reference to FIGS. 1B and 1C occurs, whereby the design efficiency cannot be increased.

As a third comparative example of the embodiment, only circuit blocks (e.g. data driver blocks) having the same function may be divided and arranged in the direction D1. However, since the integrated circuit device can be provided with only a single function (e.g. function of the data driver) in the third comparative example, development of various products cannot be realized. In the embodiment, the circuit blocks CB1 to CBN include circuit blocks having at least two different functions. Therefore, various integrated circuit devices corresponding to various types of display panels can be provided as shown in FIGS. 4, 5A, and 5B.

3. Circuit Configuration

Figure 7:
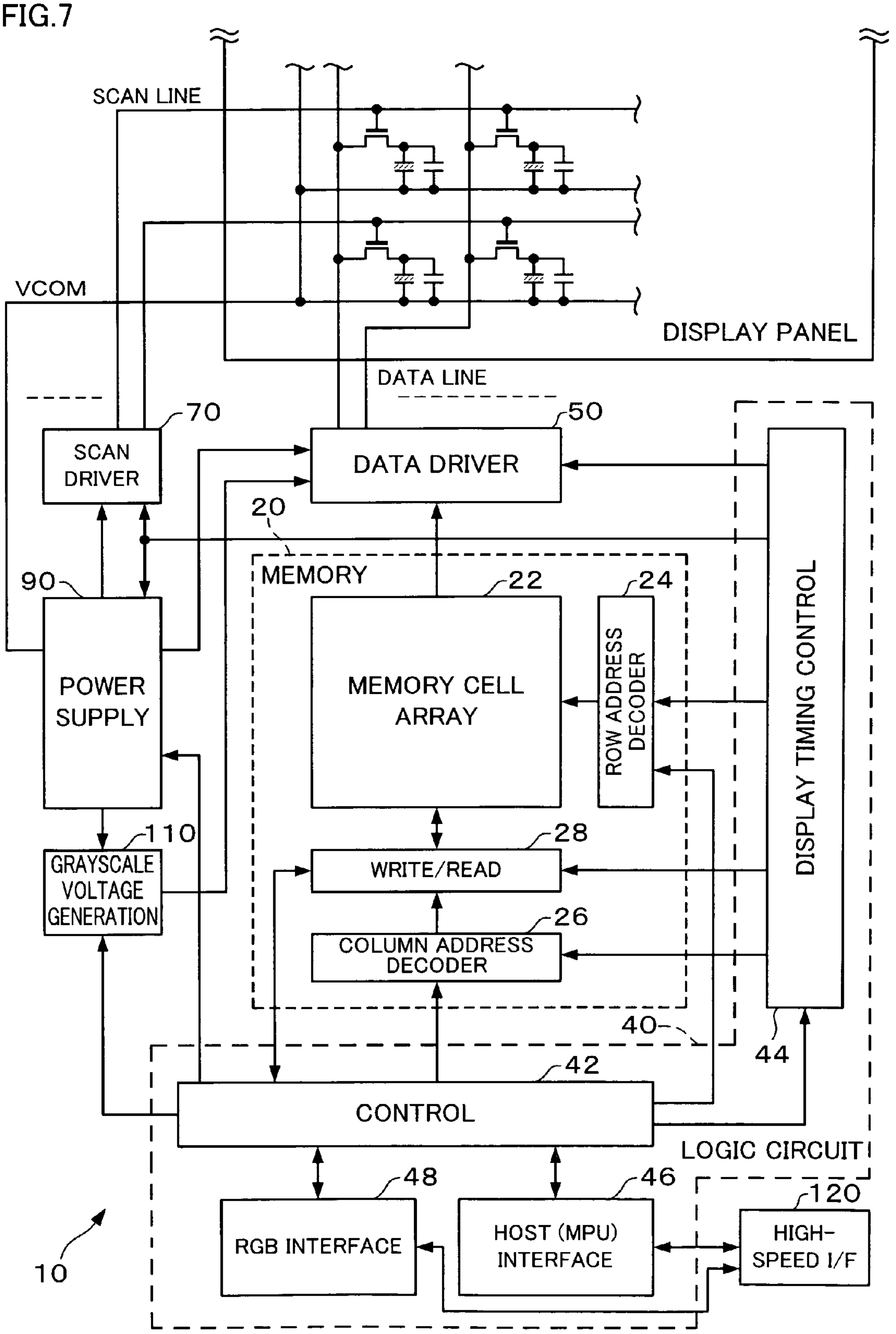
FIG. 7 is a circuit configuration example of the integrated circuit device.

FIG. 7 shows a circuit configuration example of the integrated circuit device 10. The circuit configuration of the integrated circuit device 10 is not limited to the circuit configuration shown in FIG. 7. Various modifications and variations may be made. A memory 20 (display data RAM) stores image data. A memory cell array 22 includes a plurality of memory cells, and stores image data (display data) for at least one frame (one screen). In this case, one pixel is made up of R, G, and B subpixels (three dots), and 6-bit (k-bit) image data is stored for each subpixel, for example. A row address decoder 24 (MPU/LCD row address decoder) decodes a row address and selects a wordline of the memory cell array 22. A column address decoder 26 (MPU column address decoder) decodes a column address and selects a bitline of the memory cell array 22. A write/read circuit 28 (MPU write/read circuit) writes image data into the memory cell array 22 or reads image data from the memory cell array 22. An access region of the memory cell array 22 is defined by a rectangle having a start address and an end address as opposite vertices. Specifically, the access region is defined by the column address and the row address of the start address and the column address and the row address of the end address so that memory access is performed.

A logic circuit 40 (e.g. automatic placement and routing circuit) generates a control signal for controlling display timing, a control signal for controlling data processing timing, and the like. The logic circuit 40 may be formed by automatic placement and routing such as a gate array (G/A). A control circuit 42 generates various control signals and controls the entire device. In more detail, the control circuit 42 outputs grayscale characteristic (γ-characteristic) adjustment data (γ-correction data) to a grayscale voltage generation circuit 110 and controls voltage generation of a power supply circuit 90. The control circuit 42 controls write/read processing for the memory using the row address decoder 24, the column address decoder 26, and the write/read circuit 28. A display timing control circuit 44 generates various control signals for controlling display timing, and controls reading of image data from the memory into the display panel. A host (MPU) interface circuit 46 realizes a host interface which accesses the memory by generating an internal pulse each time accessed by the host. An RGB interface circuit 48 realizes an RGB interface which writes motion picture RGB data into the memory based on a dot clock signal. The integrated circuit device 10 may be configured to include only one of the host interface circuit 46 and the RGB interface circuit 48.

A high-speed I/F circuit 120 realizes high-speed serial transfer through a serial bus. In more detail, the high-speed I/F circuit 120 realizes high-speed serial transfer with a host (host device) by current-driving or voltage-driving differential signal lines of the serial bus.

In FIG. 7, the high-speed I/F circuit 120, the host interface circuit 46, and the RGB interface circuit 48 access the memory 20 in pixel units. Image data designated by the line address and read in line units is supplied to the data driver 50 in line cycle at an internal display timing independent of the high-speed I/F circuit 120, the host interface circuit 46, and the RGB interface circuit 48.

Figure 8A:
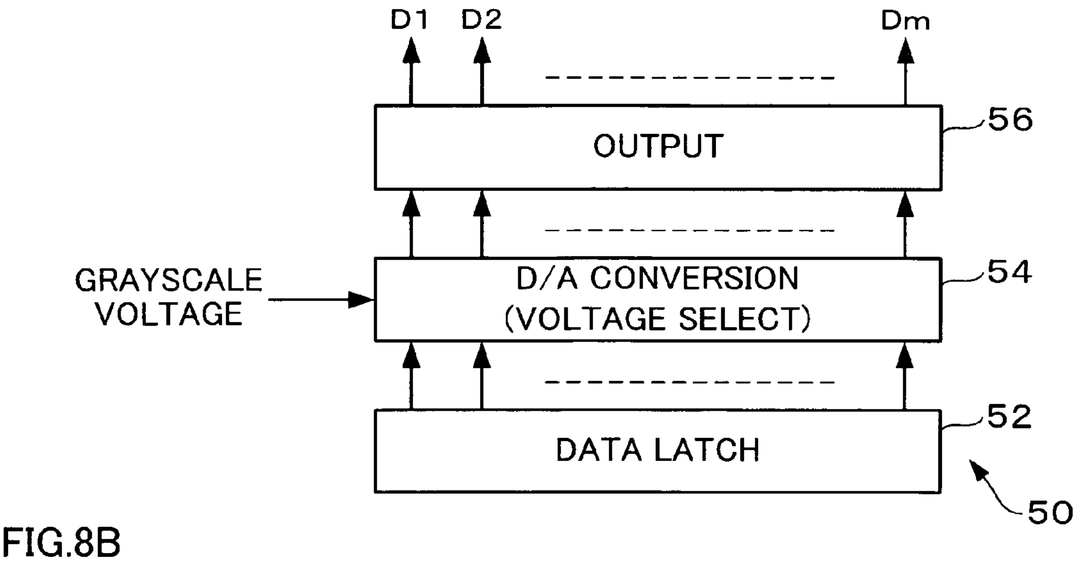
FIGS. 8A to 8C are configuration examples of a data driver and a scan driver.

The data driver 50 is a circuit for driving a data line of the display panel. FIG. 8A shows a configuration example of the data driver 50. A data latch circuit 52 latches the digital image data from the memory 20. A D/A conversion circuit 54 (voltage select circuit) performs D/A conversion of the digital image data latched by the data latch circuit 52, and generates an analog data voltage. In more detail, the D/A conversion circuit 54 receives a plurality of (e.g. 64 stages) grayscale voltages (reference voltages) from the grayscale voltage generation circuit 110, selects a voltage corresponding to the digital image data from the grayscale voltages, and outputs the selected voltage as the data voltage. An output circuit 56 (driver circuit or buffer circuit) buffers the data voltage from the D/A conversion circuit 54, and outputs the data voltage to the data line of the display panel to drive the data line. A part of the output circuit 56 (e.g. output stage of operational amplifier) may not be included in the data driver 50 and may be disposed in other region.

Figure 8B:
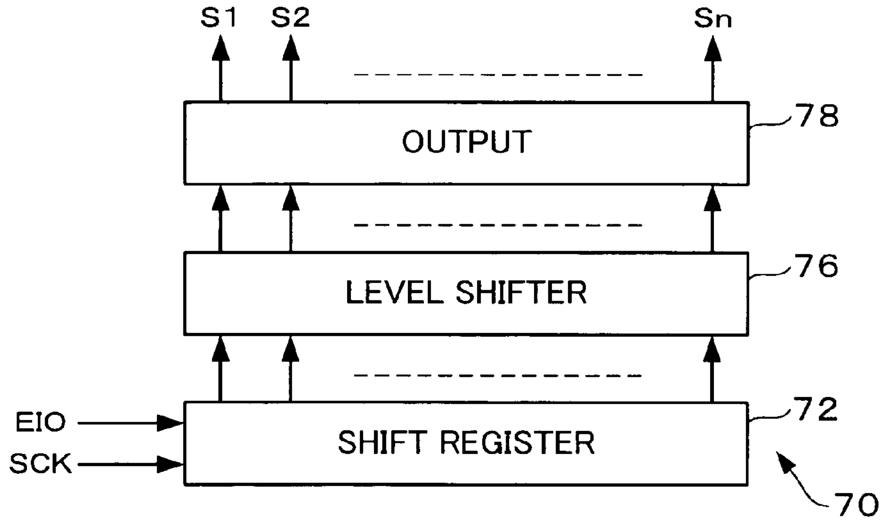
Figure 8C:
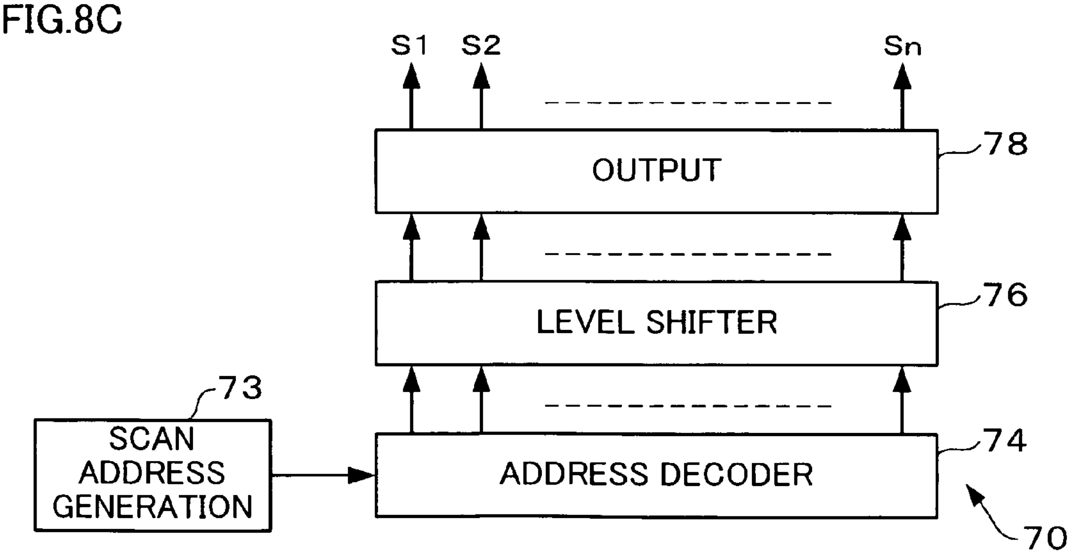

A scan driver 70 is a circuit for driving a scan line of the display panel. FIG. 8B shows a configuration example of the scan driver 70. A shift register 72 includes a plurality of sequentially connected flip-flops, and sequentially shifts an enable input-output signal EIO in synchronization with a shift clock signal SCK. A level shifter 76 converts the voltage level of the signal from the shift register 72 into a high voltage level for selecting the scan line. An output circuit 78 buffers a scan voltage converted and output by the level shifter 76, and outputs the scan voltage to the scan line of the display panel to drive the scan line. The scan driver 70 may be configured as shown in FIG. 8C. In FIG. 8C, a scan address generation circuit 73 generates and outputs a scan address, and an address decoder decodes the scan address. The scan voltage is output to the scan line specified by the decode processing through the level shifter 76 and the output circuit 78.

Figure 9A:
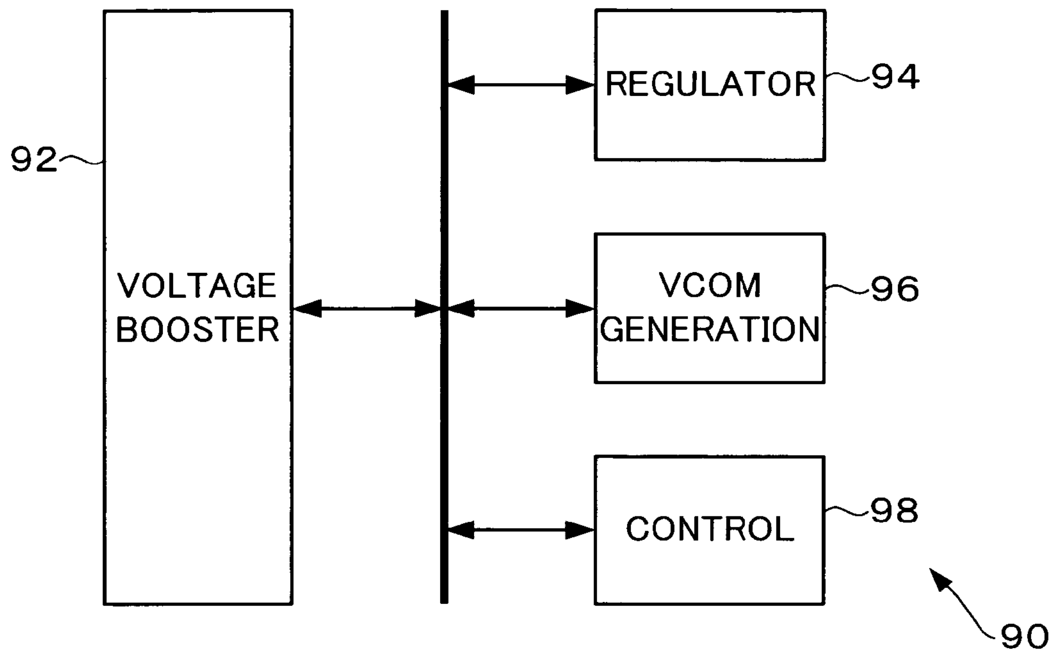
FIGS. 9A and 9B are configuration examples of a power supply circuit and a grayscale voltage generation circuit.

The power supply circuit 90 is a circuit which generates various power supply voltages. FIG. 9A shows a configuration example of the power supply circuit 90. A voltage booster circuit 92 is a circuit which generates a boosted voltage by boosting an input power source voltage or an internal power supply voltage by a charge-pump method using a boost capacitor and a boost transistor, and may include first to fourth voltage booster circuits and the like. A high voltage used by the scan driver 70 and the grayscale voltage generation circuit 110 can be generated by the voltage booster circuit 92. A regulator circuit 94 regulates the level of the boosted voltage generated by the voltage booster circuit 92. A VCOM generation circuit 96 generates and outputs a voltage VCOM supplied to a common electrode of the display panel. A control circuit 98 controls the power supply circuit 90, and includes various control registers and the like.

Figure 9B:
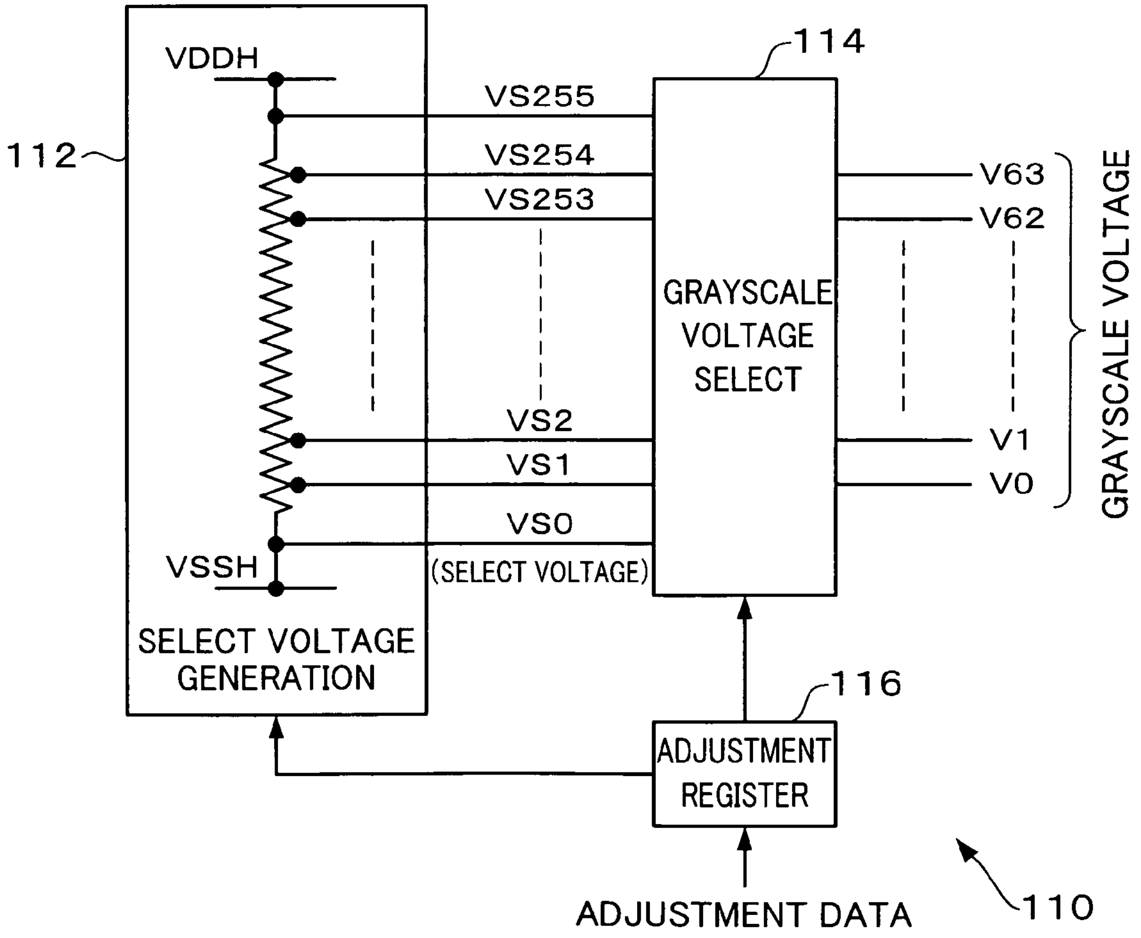

The grayscale voltage generation circuit 110 (γ-correction circuit) is a circuit which generates grayscale voltages. FIG. 9B shows a configuration example of the grayscale voltage generation circuit 110. A select voltage generation circuit 112 (voltage divider circuit) outputs select voltages VS0 to VS255 (R select voltages in a broad sense) based on high-voltage power supply voltages VDDH and VSSH generated by the power supply circuit 90. In more detail, the select voltage generation circuit 112 includes a ladder resistor circuit including a plurality of resistor elements connected in series. The select voltage generation circuit 112 outputs voltages obtained by dividing the power supply voltages VDDH and VSSH using the ladder resistor circuit as the select voltages VS0 to VS255. A grayscale voltage select circuit 114 selects 64 (S in a broad sense; R>S) voltages from the select voltages VS0 to VS255 in the case of using 64 grayscales based on the grayscale characteristic adjustment data set in an adjustment register 116 by the logic circuit 40, and outputs the selected voltages as grayscale voltages V0 to V63. This enables generation of a grayscale voltage having grayscale characteristics (γ-correction characteristics) optimum for the display panel. In the case of performing a polarity reversal drive, a positive ladder resistor circuit and a negative ladder resistor circuit may be provided in the select voltage generation circuit 112. The resistance value of each resistor element of the ladder resistor circuit may be changed based on the adjustment data set in the adjustment register 116. An impedance conversion circuit (voltage-follower-connected operational amplifier)

may be provided in the select voltage generation circuit 112 or the grayscale voltage select circuit 114.

Figure 10A:
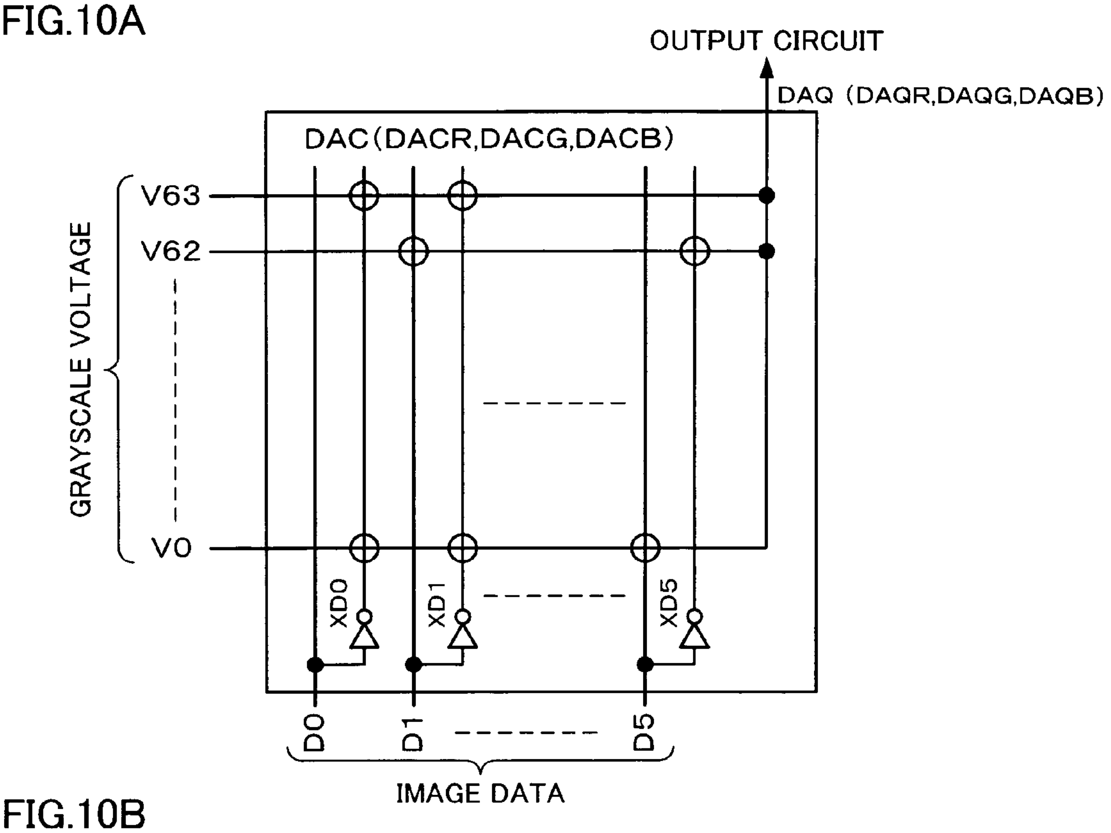
FIGS. 10A to 10C are configuration examples of a D/A conversion circuit and an output circuit.

FIG. 10A shows a configuration example of a digital-analog converter (DAC) included in the D/A conversion circuit 54 shown in FIG. 8A. The DAC shown in FIG. 10A may be provided in subpixel units (or pixel units), and may be formed by a ROM decoder and the like. The DAC selects one of the grayscale voltages V0 to V63 from the grayscale voltage generation circuit 110 based on 6-bit digital image data D0 to D5 and inverted data XD0 to XD5 from the memory 20 to convert the image data D0 to D5 into an analog voltage. The DAC outputs the resulting analog voltage signal DAQ (DAQR, DAQG, DAQB) to the output circuit 56.

When R, G, and B data signals are multiplexed and supplied to a low-temperature polysilicon TFT display driver or the like (FIG. 10C), R, G, and B image data may be D/A converted by using one common DAC. In this case, the DAC shown in FIG. 10A is provided in pixel units.

Figure 10B:
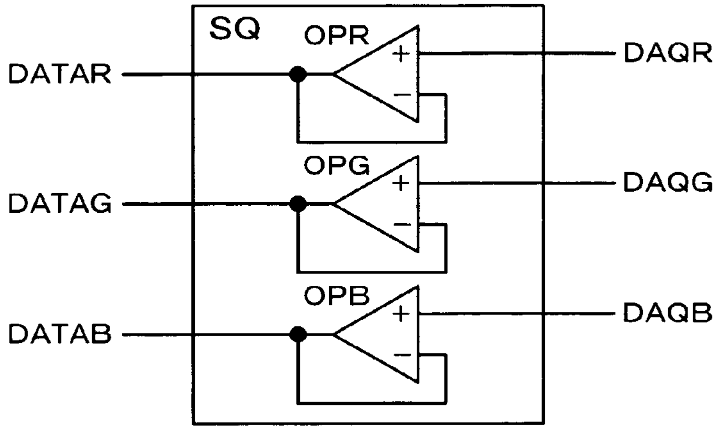
Figure 10C:
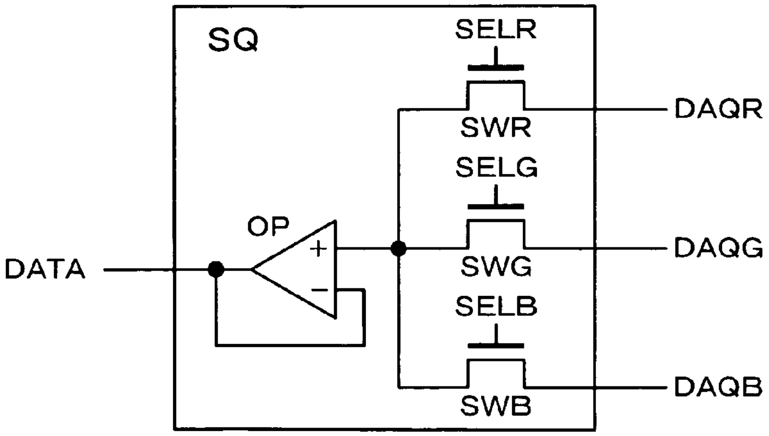

FIG. 10B shows a configuration example of an output section SQ included in the output circuit 56 shown in FIG. 8A. The output section SQ shown in FIG. 10B may be provided in pixel units. The output section SQ includes R (red), G (green), and B (blue) impedance conversion circuits OPR, OPG, and OPB (voltage-follower-connected operational amplifiers), performs impedance conversion of the signals DAQR, DAQG, and DAQB from the DAC, and outputs data signals DATAR, DATAG, and DATAB to R, G, and B data signal output lines. When using a low-temperature polysilicon TFT panel, switch elements (switch transistors) SWR, SWG, and SWB as shown in FIG. 10C may be provided, and the impedance conversion circuit OP may output a data signal DATA in which the R, G, and B data signals are multiplexed. The data signals may be multiplexed over a plurality of pixels. Only the switch elements and the like may be provided in the output section SQ without providing the impedance conversion circuit as shown in FIGS. 10B and 10C.

Figure 11A:
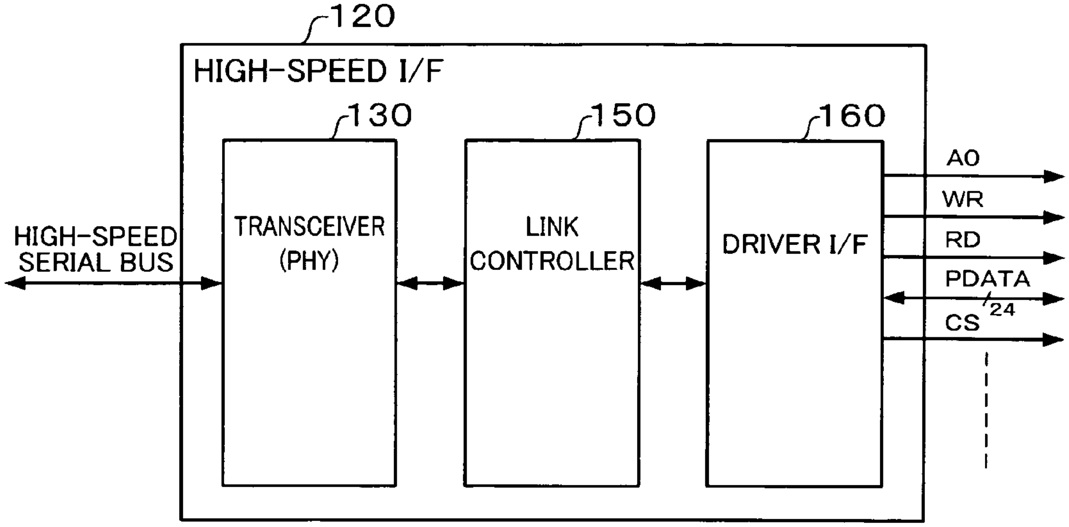
FIGS. 11A to 11C are configuration examples of a high-speed I/F circuit and a transceiver.

The high-speed I/F circuit (serial interface circuit) 120 shown in FIG. 7 is a circuit which transfers data through a serial bus (high-speed serial bus) using differential signals. FIG. 11A shows a configuration example of the high-speed I/F circuit 120.

A transceiver 130 is a circuit for receiving or transmitting a packet (command or data) through a serial bus using differential signals (differential data signals, differential strobe signals, and differential clock signals). In more detail, a packet is transmitted or received by current-driving or voltage-driving differential signal lines of the serial bus. The transceiver 130 may include a physical layer circuit (analog front-end circuit) which drives the differential signal lines, a high-speed logic circuit (serial/parallel conversion circuit and parallel/serial conversion circuit), and the like. As a serial bus interface standard, the mobile display digital interface (MDDI) standard or the like may be employed. The differential signal lines of the serial bus may have a multi-channel configuration. The transceiver 130 includes at least one of a receiver circuit and a transmitter circuit, and may be configured to exclude the transmitter circuit.

A link controller 150 performs processing of a link layer and a transaction layer which are upper layer of the physical layer. In more detail, when the transceiver 130 receives a packet from the host (host device) through the serial bus, the link controller 150 analyzes the received packet. Specifically, the link controller 150 separates the header and data of the received packet and extracts the header. When transmitting a packet to the host through the serial bus, the link controller 150 generates a packet. In more detail, the link controller 150 generates a header of a transmission target packet, and assembles a packet by combining the header and data. The link controller 150 directs the transceiver 130 to transmit the generated packet.

A driver I/F 160 performs interface processing between the high-speed I/F circuit 120 and the internal circuit of the display driver. In more detail, the driver I/F circuit 160 generates host interface signals including an address 0 signal A0, a write signal WR, a read signal RD, a parallel data signal PDATA, a chip select signal CS, and the like, and outputs the generated signals to the internal circuit (host interface circuit 46) of the display driver.

Figure 11B:
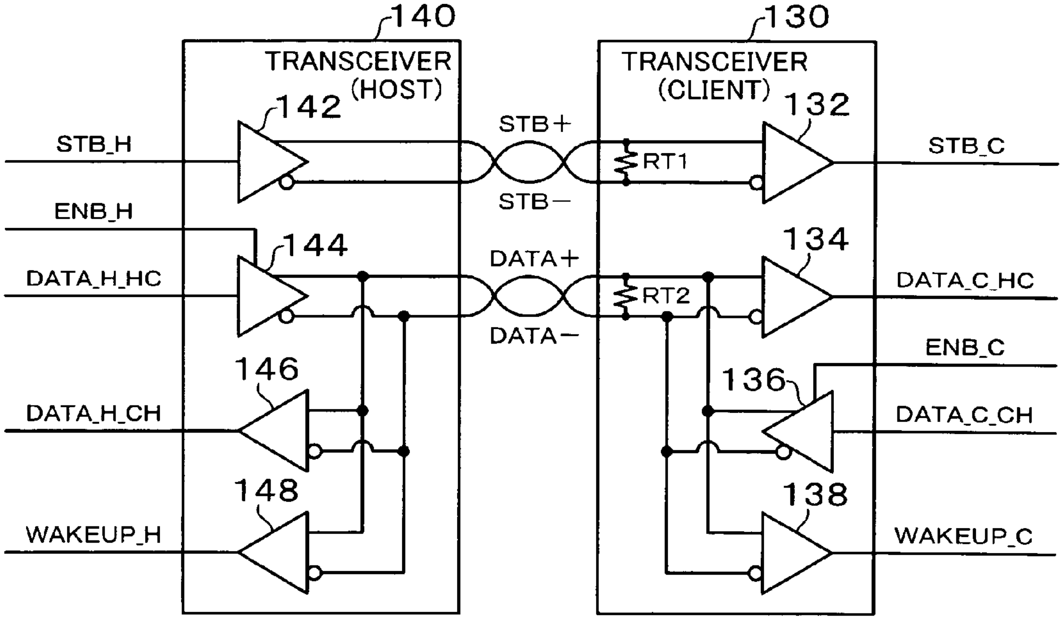
Figure 11C:
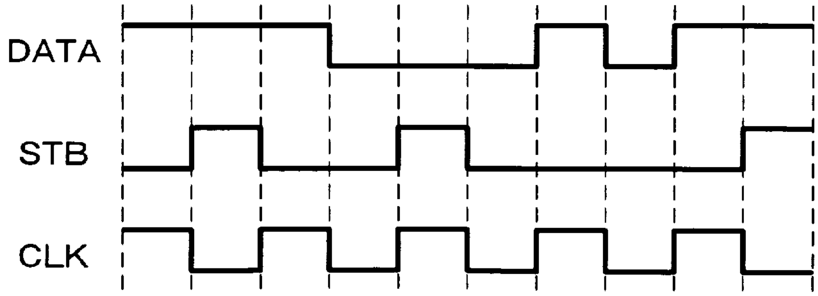

FIG. 11B shows a configuration example of the transceiver. FIG. 11B is an example of a transceiver conforming to the MDDI standard. In FIG. 11B, a transceiver 140 is provided in the host device, and the transceiver 130 is provided in the display driver. Reference numerals 136, 142, and 144 indicate transmitter circuits, and reference numerals 132, 134, and 146 indicate transmitter circuits. Reference numerals 138 and 148 indicate wakeup detection circuits. The host-side transmitter circuit 142 drives differential strobe signals STB+/−. The client-side receiver circuit 132 amplifies the voltage across a resistor RT1 generated by driving the differential strobe signals STB+/−, and outputs a strobe signal STB_C to the circuit in the subsequent stage. The host-side transmitter circuit 144 drives differential data signals DATA+/−. The client-side receiver circuit 134 amplifies the voltage across a resistor RT2 generated by driving the differential data signals DATA+/−, and outputs a data signal DATA_C_HC to the circuit in the subsequent stage. As shown in FIG. 11C, the transmitter side generates a strobe signal STB by calculating the exclusive OR between a data signal DATA and a clock signal CLK, and transmits the strobe signal STB to the receiver side through the high-speed serial bus. The receiver side calculates the exclusive OR between the data signal DATA and the strobe signal STB to reproduce the clock signal CLK.

The configuration of the transceiver is not limited to the configuration shown in FIG. 11B. Various modifications and variations may be made as shown in FIGS. 12A and 12B, for example.

Figure 12A:
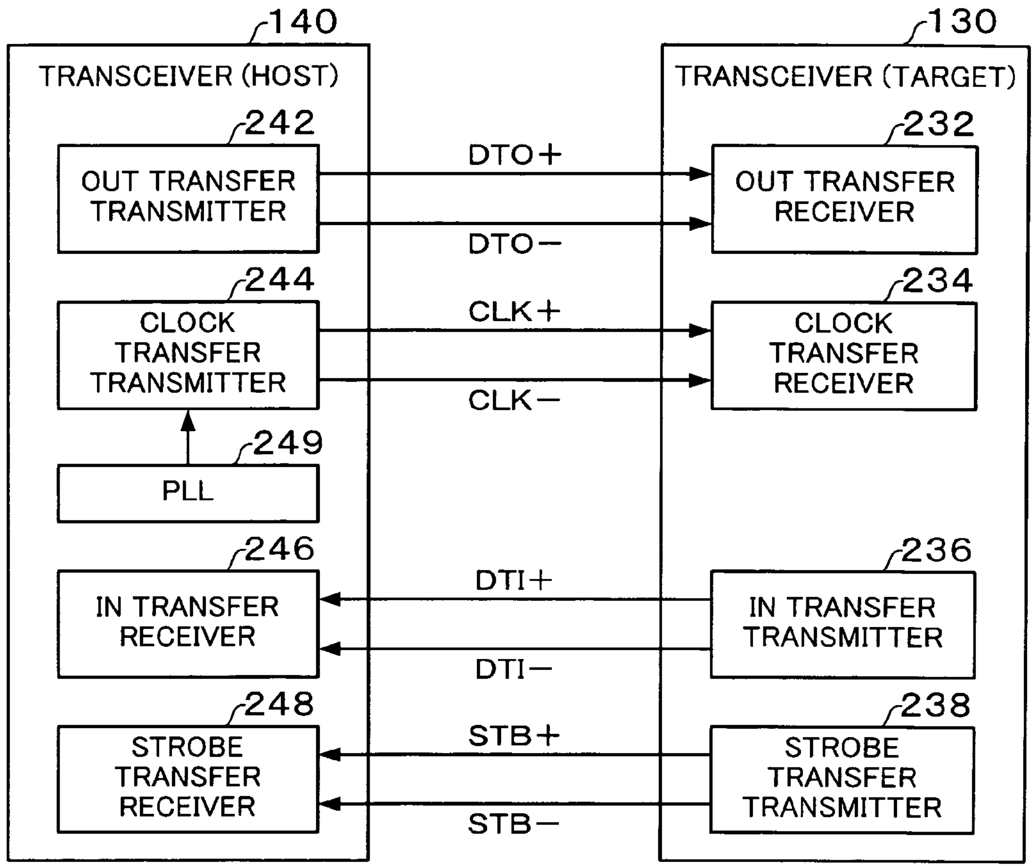
FIGS. 12A and 12B are other configuration examples of the transceiver.

In a first modification shown in FIG. 12A, DTO+ and DTO− indicate differential data signals (OUT data) output from a host-side transmitter circuit 242 to a target-side receiver circuit 232. CLK+ and CLK− indicate differential clock signals output from a host-side transmitter circuit 244 to a target-side receiver circuit 234. The host side outputs the data signals DTO+/− in synchronization with the edge of the clock signals CLK+/−. Therefore, the target can sample and store the data signals DTO+/− by using the clock signals CLK+/−. In FIG. 12A, the target side operates based on the clock signals CLK+/− supplied from the host side. Specifically, the clock signals CLK+/− serve as a system clock signal of the target side. Therefore, a PLL circuit 249 is provided on the host side and is not provided on the target side.

DTI+ and DTI− indicate differential data signals (IN data) output from a target-side transmitter circuit 236 to a host-side receiver circuit 246. STB+ and STB− indicate differential strobe signals output from a target-side transmitter circuit 238 to a host-side receiver circuit 248. The target side generates and outputs the strobe signals STB+/− based on the clock signals CLK+/− supplied from the host side. The target side outputs the data signals DTI+/− in synchronization with the edge of the strobe signals STB+/−. Therefore, the host can sample and store the data signals DTI+/− by using the strobe signals STB+/−.

Figure 12B:
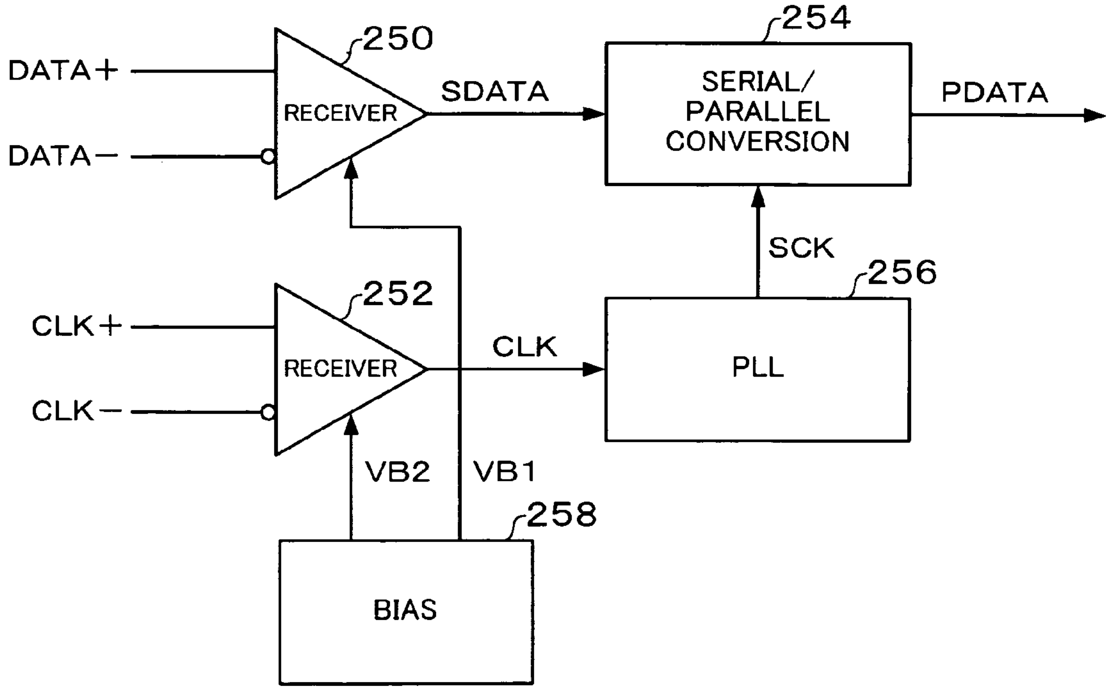

In a second modification shown in FIG. 12B, a data receiver circuit 250 receives the differential data signals DATA+ and DATA−. The receiver circuit 250 amplifies the voltage generated across a resistor element (not shown) provided between the signal lines for the data signals DATA+ and DATA−, and outputs the resulting serial data SDATA to a serial/parallel conversion circuit 254 in the subsequent stage. A clock signal receiver circuit 252 receives the differential clock signals CLK+ and CLK−. The receiver circuit 252 amplifies the voltage generated across a resistor element (not shown) provided between the signal lines for the clock signals CLK+ and CLK−, and outputs the resulting clock signal CLK to a PLL circuit 256 in the subsequent stage. The serial/parallel conversion circuit 254 samples the serial data SDATA from the data receiver circuit 250, converts the serial data SDATA into parallel data PDATA, and outputs the parallel data PDATA. The phase locked loop (PLL) circuit 256 generates a sampling clock signal SCK for sampling the data received by the data receiver circuit 250 based on the clock signal CLK received by the clock signal receiver circuit 252. In more detail, the PLL circuit 256 outputs multiphase sampling clock signals at the same frequency but with different phases to the serial/parallel conversion circuit 254 as the sampling clock signal SCK. The serial/parallel conversion circuit 254 samples the serial data SDATA by using the multiphase sampling clock signals, and outputs the parallel data PDATA. A bias circuit 258 generates bias voltages VB1 and VB2 for controlling a bias current, and supplies the bias voltages VB1 and VB2 to the receiver circuits 250 and 252.

4. High-Speed I/F Circuit Block 4.1 Arrangement of High-Speed I/F Circuit Block

Figure 13A:
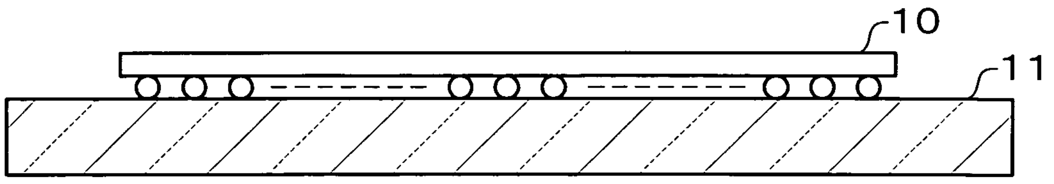
FIGS. 13A to 13C are diagrams illustrative of a bump contact resistance problem.

FIG. 13A shows a state when mounting the integrated circuit device 10 on a glass substrate 11 by using chip-on-glass (COG) mounting technology. In the COG mounting technology, the chip of the integrated circuit device 10 on which gold bumps or the like are formed is directly mounted face-down on the glass substrate 11 of the display panel. This enables the thickness of the LCD module to be reduced to the thickness of the LCD glass.

Figure 13B:
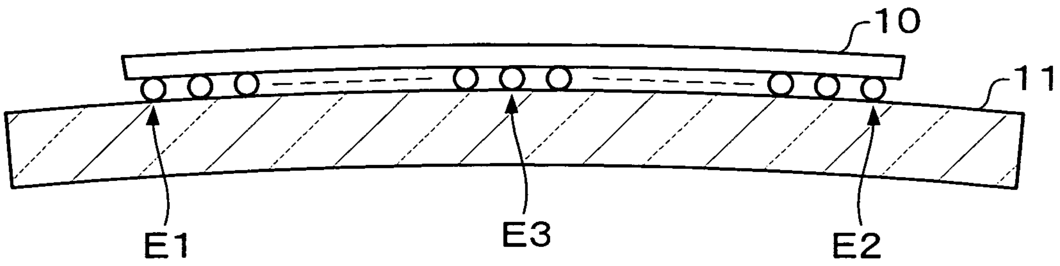
Figure 13C:
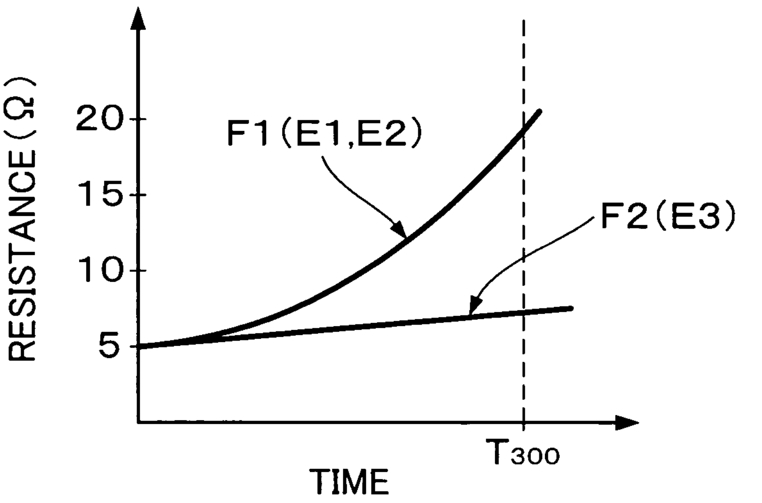

However, the contact resistance of the bump is increased on each end of the integrated circuit device 10 when mounting the integrated circuit device 10 by using the COG mounting technology or the like. Specifically, the integrated circuit device 10 and the glass substrate 11 differ in coefficient of thermal expansion. Therefore, stress (thermal stress) caused by the difference in coefficient of thermal expansion is greater on each end of the integrated circuit device 10 indicated by E1 and E2 than at the center of the integrated circuit device 10 indicated by E3. As a result, the contact resistance of the bump is increased on each end indicated by E1 and E2 with the passage of time. For example, when performing 300 cycles of a temperature cycle test corresponding to the change over ten years as shown in FIG. 13C, the contact resistance at the center indicated by E3 in FIG. 13B is increased from about five ohms to about seven ohms as indicated by F2 in FIG. 13C. On the other hand, the contact resistance on each end indicated by El and E2 in FIG. 13B is increased to about 20 ohms as indicated by F1 in FIG. 13C. In particular, the slimer the integrated circuit device 10 (the higher the chip shape ratio SP=LD/W) as shown in FIG. 2B, the larger the difference in stress between each end and the center and the greater the increase in the contact resistance of the bump on each end.

In the high-speed I/F circuit, the impedance is matched between the transmitter side and the receiver side in order to prevent signal reflection. However, if the pads connected with the bumps on each end of the integrated circuit device 10 are used as the pads (e.g. DATA+ and DATA−) of the high-speed I/F circuit, an impedance mismatch occurs due to an increase in the contact resistance of the bump as indicated by F1. As a result, the high-speed serial transfer signal quality deteriorates.

Figure 14A:
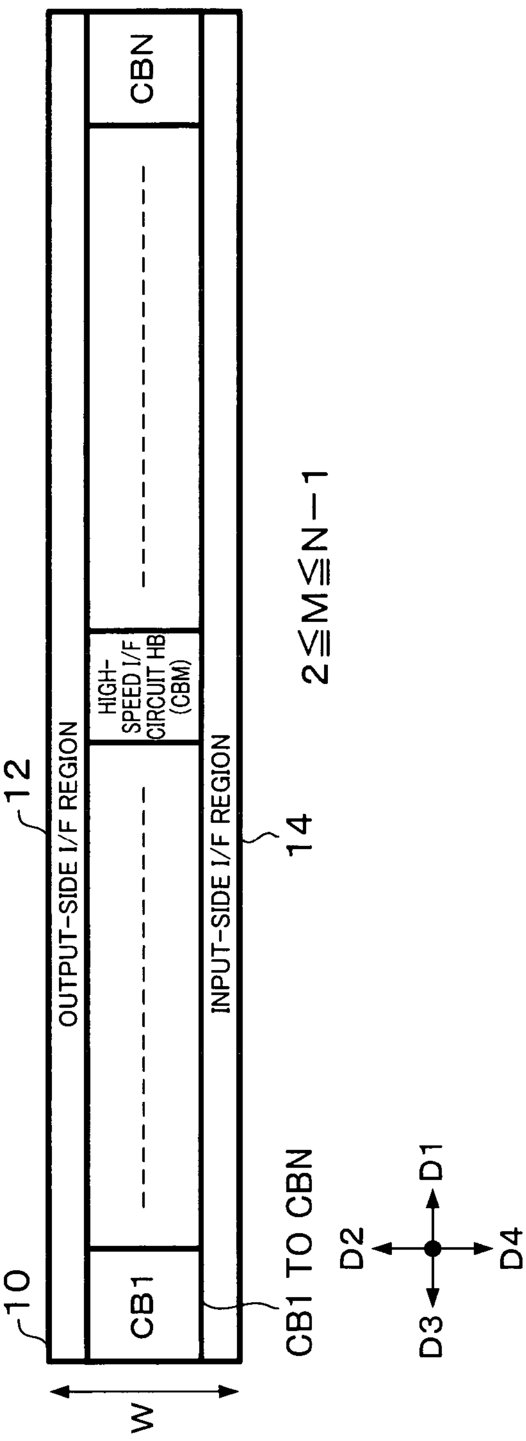
FIGS. 14A and 14B are diagrams illustrative of a high-speed I/F circuit arrangement method.

In the embodiment, a high-speed I/F circuit (high-speed serial interface circuit) block is disposed near the center of the integrated circuit device 10 excluding each end of the integrated circuit device 10 in order to solve such a problem. In more detail, as shown in FIG. 14A, the first to Nth circuit blocks CB1 to CBN include a high-speed I/F circuit block HB which transfers data through the serial bus using the differential signals, and a circuit block other than the high-speed I/F circuit block HB (circuit block which realizes a function differing from the function of the high-speed I/F circuit block HB). The circuit block other than the high-speed I/F circuit block HB is a data driver block (50 in FIG. 7), for example. Or, the circuit block other than the high-speed I/F circuit block HB is a logic circuit block, a power supply circuit block, or a grayscale voltage generation circuit block (40, 90, and 110 in FIG. 7). Or, the circuit block other than the high-speed I/F circuit block HB is a memory block (20 in FIG. 7) when the integrated circuit device includes a memory, or a scan driver block (70 in FIG. 7) when the integrated circuit device is used for an amorphous TFT.

In the embodiment, as shown in FIG. 14A, the high-speed I/F circuit block HB is disposed as the Mth circuit block CBM ($2 \leqq M \leqq N-1$) of the circuit blocks CB1 to CBN. Specifically, the high-speed I/F circuit block HB is disposed as the circuit block CBM excluding the circuit blocks CB1 and CBN on either end of the integrated circuit device 10. This prevents the high-speed I/F circuit block HB from being disposed on the ends of the integrated circuit device 10. Therefore, an impedance mismatch due to an increase in the contact resistance as indicated by F1 in FIG. 13C can be reduced, whereby deterioration of the high-speed serial transfer signal quality can be reduced.

Figure 14B:
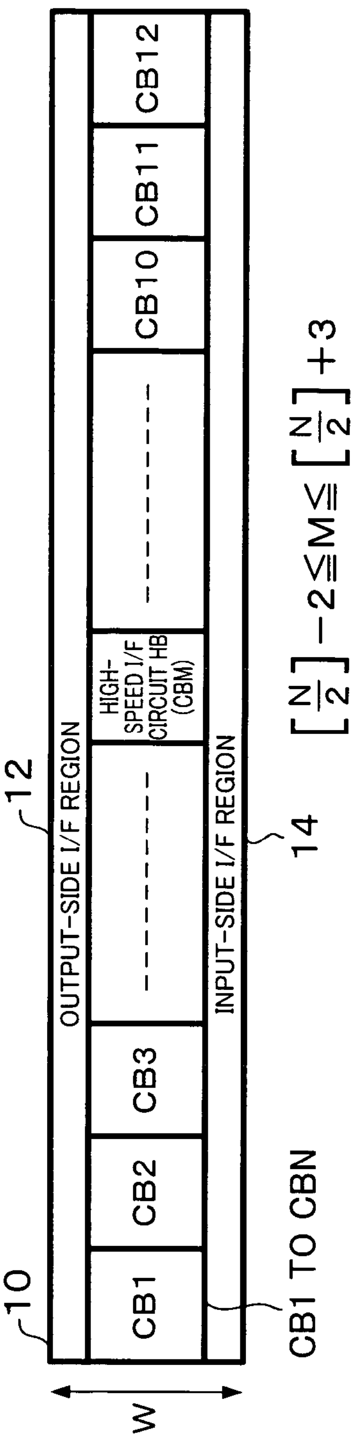

In order to minimize an increase in the contact resistance to improve the signal quality, the value M of the circuit block CBM disposed as the high-speed I/F circuit block HB may be set at "$[N/2]-2 \leqq M \leqq [N/2]+3$", as shown in FIG. 14B. [X] is the maximum integer which does not exceed X. For example, when the number of circuit blocks is N=12, $4 \leqq M \leqq 9$. Therefore, the high-speed I/F circuit block HB is disposed as one of the circuit blocks CB4 to CB9 of the circuit blocks CB1 to CB12. This ensures that the high-speed I/F circuit block HB is disposed near the center of the integrated circuit device 10. Therefore, the contact resistance of the bump or the like has the characteristics as indicated by F2 in FIG. 13C, whereby an impedance mismatch due to an increase in the contact resistance can be further reduced. In addition, the value M may be set at "$[N/2]-1 \leqq M \leqq [N/2]+2$". This ensures that the high-speed I/F circuit block HB is disposed nearer to the center of the integrated circuit device 10, whereby an impedance mismatch can be minimized.

The arrangement of the high-speed I/F circuit block HB may be subjected to various modifications and variations. In the layout example shown in FIG. 5B, the high-speed I/F circuit block HB is disposed between the memory block MB2 and the data driver block DB3. However, the high-speed I/F circuit block HB may be disposed between the memory block MB1 and the data driver block DB2 or between the memory block MB3 and the data driver block DB4. In FIG. 5B, image data used by the Jth data driver block DBJ ($1 \leqq J < I$) is stored in the Jth memory block MBJ, and many signal lines are provided between the memory block MBJ and the data driver block DBJ. Therefore, it is preferable to dispose the high-speed I/F circuit block HB between the memory block MBJ and the data driver block DBJ+1 instead of disposing the high-speed I/F circuit block HB between the data driver block DBJ and the memory block MBJ.

In FIG. 5B, the high-speed I/F circuit block HB may be disposed between the scan driver block SB1 and the power supply circuit block PB or between the power supply circuit block PB and the data driver block DB1. Or, the high-speed I/F circuit block HB may be disposed between the grayscale voltage generation circuit block GB and the logic circuit block LB or between the logic circuit block LB and the scan driver block SB2. However, since the data received by the high-speed I/F circuit block HB is input to the logic circuit block LB, it is preferable to dispose the high-speed I/F circuit block HB near the logic circuit block LB. It is still more preferable to dispose the high-speed I/F circuit block HB adjacent to the logic circuit block LB. In FIG. 5B, the logic circuit block LB (and the grayscale voltage generation circuit block GB) may be disposed near the center of the integrated circuit device 10, for example. In more detail, the logic circuit block LB (and the grayscale voltage generation circuit block GB) is disposed between the memory block MB2 (MBJ in a broad sense) and the data driver block DB3 (DBJ+1 in a broad sense), for example. The high-speed I/F circuit block HB may be disposed adjacent to the logic circuit block LB.

Figure 15A:
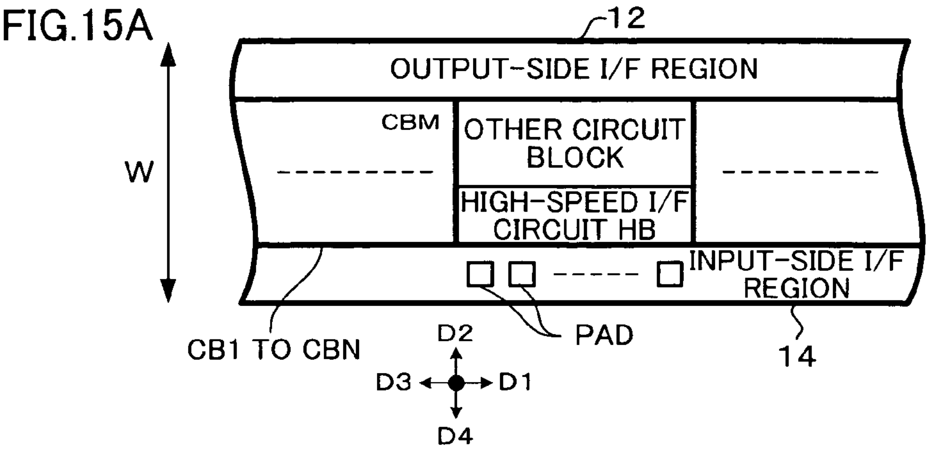
FIGS. 15A to 15D are diagrams illustrative of a high-speed I/F circuit arrangement method.

As shown in FIG. 15A, the Mth circuit block CBM may include the high-speed I/F circuit block HB and another circuit block. Specifically, a plurality of circuit blocks are provided in the Mth circuit block CBM so that one of the circuit blocks is the high-speed I/F circuit block HB. In FIG. 15A, the high-speed I/F circuit block HB is disposed adjacent to the input-side I/F region 14 (second interface region) in the direction D2. Another circuit block is disposed adjacent to the high-speed I/F circuit block HB in the direction D2.

The pads (e.g. pads for DATA+/−, STB+/−, CLK+/−, and power supply) connected with the high-speed I/F circuit block HB may be disposed in the input-side I/F region 14 in the area adjacent to the high-speed I/F circuit block HB in the direction D4. A protective element (electrostatic protection transistor) and the like may be disposed under the pads or between the pads.

Figure 15B:
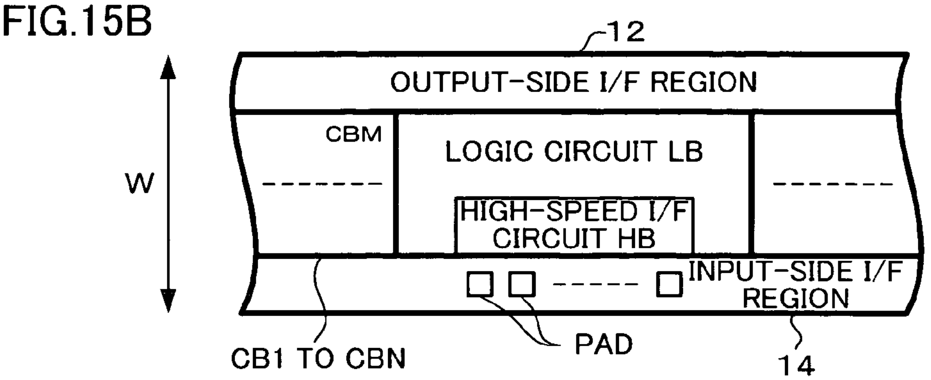

Another circuit block provided in the circuit block CBM may be the logic circuit block LB, as shown in FIG. 15B. The logic circuit block LB generates a display control signal (signal which controls display timing or display processing) or sets grayscale data. Specifically, the data received by the high-speed I/F circuit block HB is transferred to the memory block MB or the data driver block DB through the logic circuit block LB. The clock signal (including the strobe signal) received by the high-speed I/F circuit block HB is input to the logic circuit block LB, and the display control signal or the like is generated based on the clock signal. Therefore, it is preferable to dispose the high-speed I/F circuit block HB near the logic circuit block LB. This means that it is preferable that the logic circuit block LB and the high-speed I/F circuit block HB be provided in the single circuit block CBM, as shown in FIG. 15B.

In the arrangement shown in FIG. 15B, it is preferable to dispose the high-speed I/F circuit block HB adjacent to the input-side I/F region 14. This enables the data signal or the clock signal to be input from the high-speed I/F pad to the high-speed I/F circuit block HB along a short path, whereby the high-speed serial transfer signal quality can be improved.

Figure 15C:
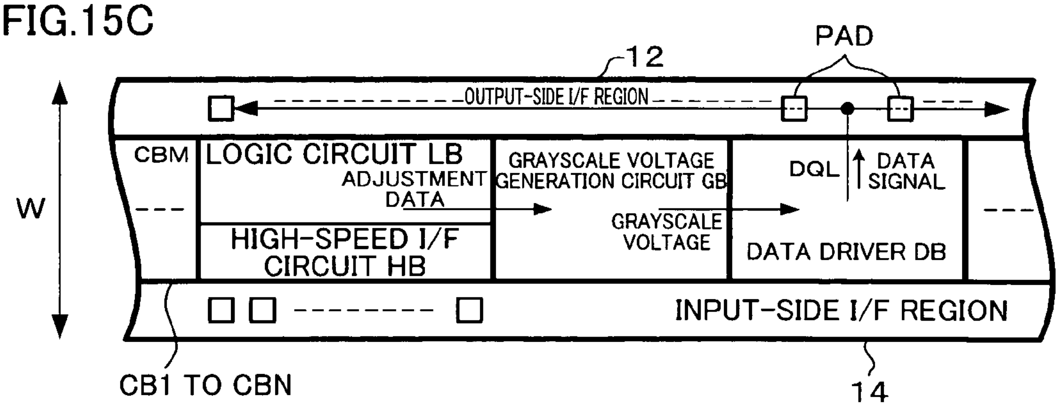

When providing the logic circuit block LB and the high-speed I/F circuit block HB in the single circuit block CBM, the circuit block CBM including the logic circuit block LB and the high-speed I/F circuit block HB may be disposed adjacent to the grayscale voltage generation circuit block GB which generates the grayscale voltage along the direction D1, as shown in FIG. 15C. Specifically, it is preferable to dispose the high-speed I/F circuit block HB adjacent to the logic circuit block LB, as described above. It is also preferable to dispose the grayscale voltage generation circuit block GB adjacent to the logic circuit block LB, as described later. Therefore, the high-speed I/F circuit block HB and the grayscale voltage generation circuit block GB can be disposed adjacent to the logic circuit block LB by disposing the circuit block CBM adjacent to the grayscale voltage generation circuit block GB as shown in FIG. 15C, whereby the layout efficiency can be increased. The grayscale voltage generation circuit block GB and the high-speed I/F circuit block HB may include analog circuits such as an impedance conversion circuit (operational amplifier). Therefore, the arrangement as shown in FIG. 15C enables an interconnect for the power supply provided to the analog circuits or the like to be used in common, whereby the layout efficiency can be further increased. In FIG. 15C, the circuit blocks CB1 to CBN include the data driver block DB. The grayscale voltage generation circuit block GB is disposed between the circuit block CBM, which includes the logic circuit block LB and the high-speed I/F circuit block HB, and the data driver block DB.

Figure 15D:
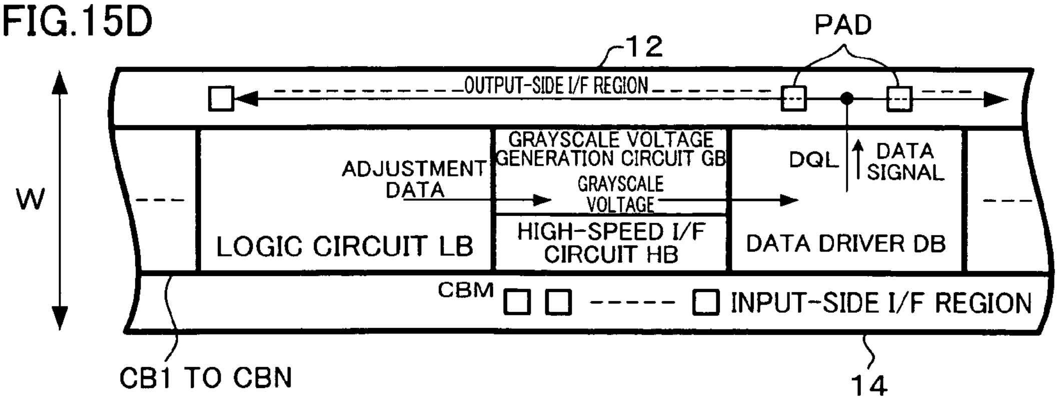

As shown in FIG. 15D, another circuit block provided in the circuit block CBM together with the high-speed I/F circuit block HB may be the grayscale voltage generation circuit block GB. Specifically, it is preferable to dispose the high-speed I/F circuit block HB adjacent to the logic circuit block LB, as described above. It is also preferable to dispose the grayscale voltage generation circuit block GB adjacent to the logic circuit block LB, as described later. Therefore, if the grayscale voltage generation circuit block GB and the high-speed I/F circuit block HB are provided in the circuit block CBM as shown in FIG. 15D, the grayscale voltage generation circuit block GB and the high-speed I/F circuit block HB can be disposed adjacent to the logic circuit block LB, whereby the layout efficiency can be increased. The grayscale voltage generation circuit block GB and the high-speed I/F circuit block HB may include analog circuits such as an impedance conversion circuit (operational amplifier), as described above. Therefore, the arrangement as shown in FIG. 15D enables an interconnect for the power supply provided to the analog circuits or the like to be used in common, whereby the layout efficiency can be further increased.

In the arrangement shown in FIGS. 15C and 15D, the high-speed I/F circuit block HB may include the physical layer circuit of the high-speed I/F circuits, and the logic circuit block LB may include an upper layer circuit of the physical layer circuit. In more detail, the transceiver 130 as the physical layer circuit of the high-speed I/F circuit 120 shown in FIG. 11A is provided in the high-speed I/F circuit block HB, and the link controller 150 and the driver I/F circuit 160 as the upper layer (link layer, transaction layer, and application layer) circuits of the physical layer are provided in the logic circuit block LB. This enables the link controller 150 and the driver I/F circuit 160 to be implemented by using an automatic placement-routing method such as a gate array, whereby the design efficiency can be increased. A part or the entirety of the high-speed logic circuit (e.g. serial/parallel conversion circuit) included in the transceiver 130 may be provided in the logic circuit block LB.

An advantage obtained by disposing the grayscale voltage generation circuit block GB and the logic circuit block LB adjacent to each other along the direction D1 as shown in FIGS. 15C and 15D is described below.

Figure 16:
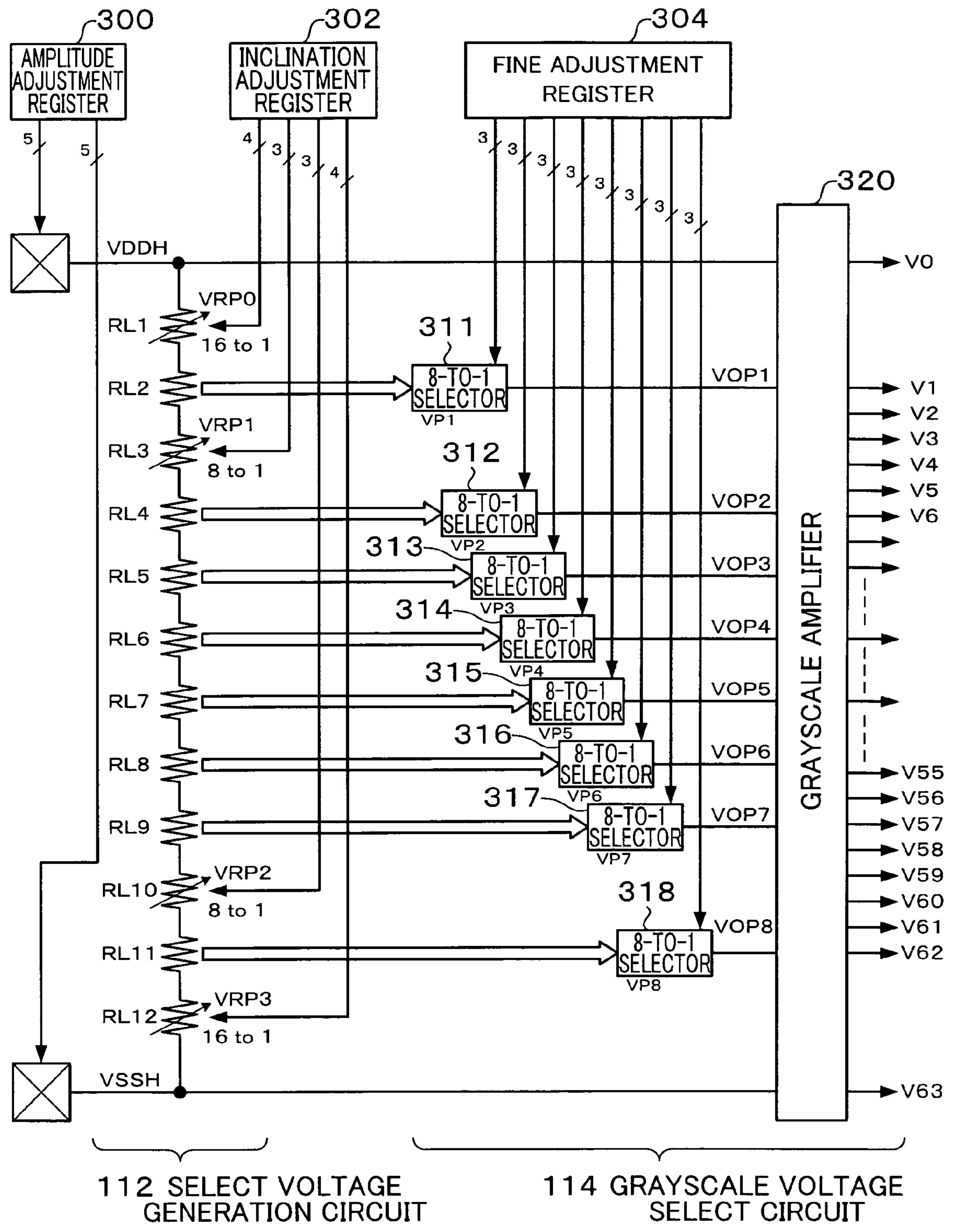
FIG. 16 is a detailed circuit configuration example of a grayscale voltage generation circuit block.
Figure 17A:
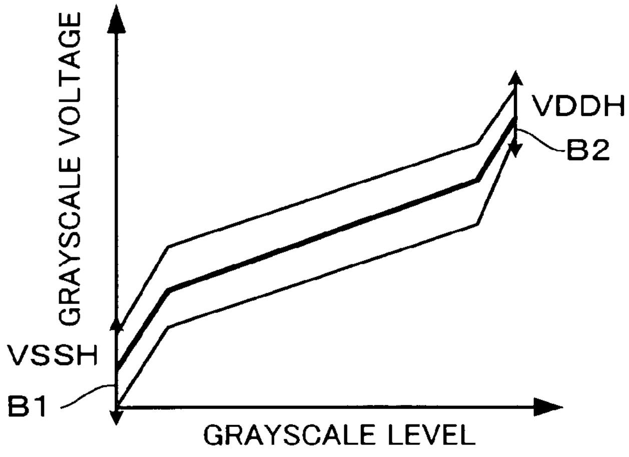
FIGS. 17A to 17C are diagrams illustrative of adjustment of grayscale characteristics.
Figure 17B:
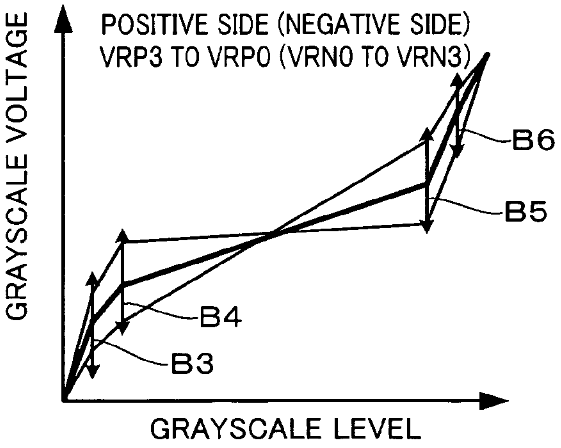
Figure 17C:
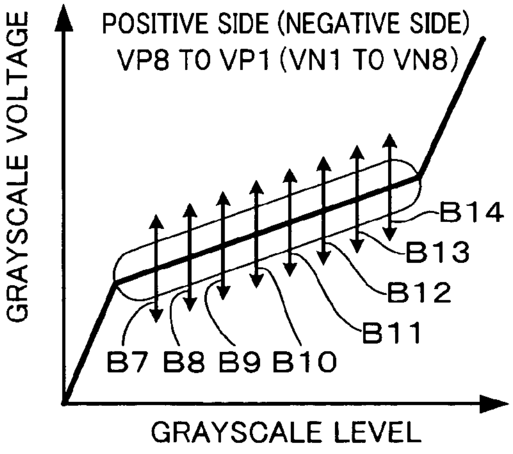

FIG. 16 shows a detailed circuit configuration example of the grayscale voltage generation circuit block GB. FIG. 16 shows a circuit for positive polarity. However, a circuit for negative polarity may be realized by using a similar configuration. The grayscale characteristic adjustment data is set in an amplitude adjustment register 300, an inclination adjustment register 302, and a fine adjustment register 304. The adjustment data is set (written) by the logic circuit block LB. For example, the voltage levels of the power supply voltages VDDH and VSSH are changed as indicated by B1 and B2 in FIG. 17A by setting the adjustment data in the amplitude adjustment register 300 so that the amplitude of the grayscale voltage can be adjusted. The grayscale voltages are changed at four points of the grayscale levels as indicated by B3 to B6 in FIG. 17B by setting the adjustment data in the inclination adjustment register 302 so that the inclination of the grayscale characteristics can be adjusted. Specifically, the resistance value of a resistor element RL12 of a resistance ladder is changed based on 4-bit adjustment data VRP3 set in the inclination adjustment register 302 so that the inclination can be adjusted as indicated by B3. This also applies to adjustment data VRP2 to VRP0. The grayscale voltages are changed at eight points of the grayscale levels as indicated by B7 to B14 in FIG. 17C by setting the adjustment data in the fine adjustment register 304 so that the grayscale characteristics can be finely adjusted. Specifically, an 8-to-1 selector 318 selects one of eight taps of a resistor element RL11 based on 3-bit adjustment data VP8 set in the fine adjustment register 304, and outputs the voltage of the selected tap as an output VOP8. This enables fine adjustment as indicated by B7 in FIG. 17C. This also applies to adjustment data VP7 to VP1.

A grayscale amplifier section 320 outputs the grayscale voltages V0 to V63 based on the outputs VOP1 to VOP8 from the 8-to-1 selectors 311 to 318 and the power supply voltages VDDH and VSSH. In more detail, the grayscale amplifier section 320 includes first to eighth impedance conversion circuits (voltage-follower-connected operational amplifiers) to which the outputs VOP1 to VOP8 are input. The grayscale voltages V1 to V62 are generated by dividing the output voltages of adjacent impedance conversion circuits of the first to eighth impedance conversion circuits by using resistors, for example.

The grayscale characteristics (γ-characteristics) optimum for the type of display panel can be obtained by the above-described adjustment, whereby the display quality can be improved.

However, the number of bits of adjustment data for performing such an adjustment is very large, as shown in FIG. 16. Therefore, the number of adjustment data signal lines from the logic circuit block LB to the grayscale voltage generation circuit block GB is also large. As a result, if the logic circuit block LB and the grayscale voltage generation circuit block GB are not disposed adjacent to each other, the chip area may be increased due to the interconnect region for the adjustment data signal lines.

In the embodiment, the logic circuit block LB and the grayscale voltage generation circuit block GB are disposed adjacent to each other along the direction D1, as shown in FIGS. 15C and 15D. This enables the adjustment data signal lines from the logic circuit block LB to be connected with the grayscale voltage generation circuit block GB along a short path, whereby an increase in the chip area due to the interconnect region can be prevented.

In FIGS. 15C and 15D, the circuit blocks CB1 to CBN include the data driver block DB which receives the grayscale voltages from the grayscale voltage generation circuit block GB and drives the data lines. In FIGS. 15C and 15D, the grayscale voltage generation circuit block GB is disposed between the data driver block DB and the logic circuit block LB. The grayscale voltage generation circuit block GB and the data driver block DB may be or may not be disposed adjacent to each other.

In FIGS. 15C and 15D, the adjustment data signal lines are disposed between the grayscale voltage generation circuit block GB and the logic circuit block LB, and the number of adjustment data signal lines is large as described with reference to FIG. 16. The grayscale voltage generation circuit block GB must output the grayscale voltages to the data driver block DB, and the number of grayscale voltage output lines is very large. Therefore, if the grayscale voltage generation circuit block GB is not disposed between the data driver block DB and the logic circuit block LB but is disposed on the side of the logic circuit block LB in the direction D3 in FIGS. 15C and 15D, not only the adjustment data signal lines but also the grayscale voltage output lines must be disposed between the grayscale voltage generation circuit block GB and the logic circuit block LB. This makes it difficult to dispose other signal lines and power supply lines between the grayscale voltage generation circuit block GB and the logic circuit block LB by using global lines or the like, whereby the interconnect efficiency is decreased.

On the other hand, since the grayscale voltage generation circuit block GB is disposed between the data driver block DB and the logic circuit block LB in FIGS. 15C and 15D, the grayscale voltage output lines need not be disposed between the grayscale voltage generation circuit block GB and the logic circuit block LB. Therefore, other signal lines and power supply lines can be disposed between the grayscale voltage generation circuit block GB and the logic circuit block LB by using global lines or the like, whereby the interconnect efficiency can be increased.

In the embodiment, the data signal output line DQL from the data driver block DB is disposed in the data driver block DB along the direction D2, as shown in FIGS. 15C and 15D. On the other hand, the data signal output line DQL is disposed in the output-side I/F region 12 (first interface region) along the direction D1 (D3). In more detail, the data signal output line DQL is disposed in the output-side I/F region 12 along the direction D1 by using a global line located in the lower layer of the pad and in the upper layer of a local line (transistor interconnect) inside the output-side I/F region 12. This enables the data signal from the data driver block DB to be properly output to the display panel through the pad by efficiently disposing the signal lines for the adjustment data, the grayscale voltages, and the data signal as shown in FIGS. 15C and 15D. Moreover, if the data signal output line DQL is disposed as shown in FIGS. 15C and 15D, the data signal output line DQL can be connected with the pads or the like by utilizing the output-side I/F region 12, whereby an increase in the width W of the integrated circuit device in the direction D2 can be prevented.

4.2 Shape Ratio and Width of Integrated Circuit Device

In the embodiment, when the width of the integrated circuit device 10 in the direction D2 is W and the length of the integrated circuit device 10 in the direction D1 is LD, the length-width shape ratio SP=LD/W of the integrated circuit device 10 is set at "SP>10", as shown in FIG. 18. Such a slim chip achieves facilitation of mounting and a reduction in cost as described with reference to FIG. 2B.

In such a slim chip having a shape ratio of SP>10, an impedance mismatch due to the contact resistance of the bump occurs as described with reference to FIGS. 13A to 13C. Specifically, the impedance mismatch problem, which does not become obvious in a square chip, is serious in the slim chip having a shape ratio of SP>10. In the embodiment, this problem is solved by employing the method shown in FIGS. 14A to 15D so that the high-speed serial transfer signal quality is successfully maintained while achieving facilitation of mounting and a reduction in cost in combination.

The size of a display panel incorporated in a portable telephone or the like is generally constant. Therefore, the width W of the integrated circuit device 10 in the direction D2 must be reduced in order to realize a slim chip having a shape ratio of SP>10 as shown in FIG. 18A.

Figures 18A, 18B, 18C:
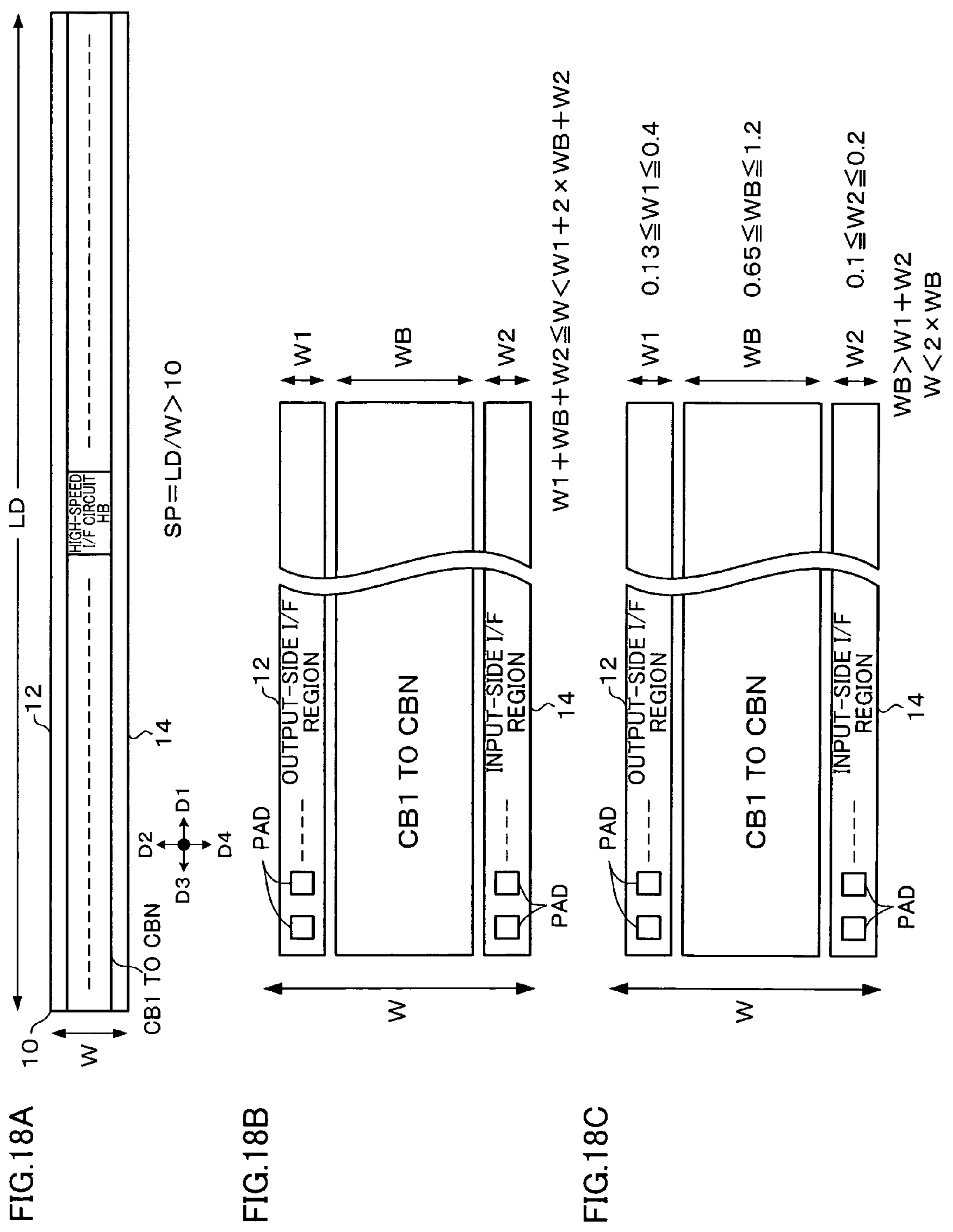
FIGS. 18A to 18C are diagrams illustrative of the shape ratio and the width of the integrated circuit device.

In the integrated circuit device of the embodiment, the relationship "W1+WB+W2≦W<W1+2×WB+W2" is satisfied, as shown in FIG. 18B. W1, WB, and W2 respectively indicate the widths of the output-side I/F region 12 (first interface region), the first to Nth circuit blocks CB1 to CBN, and the input-side I/F region 14 (second interface region) in the direction D2.

In the comparative example shown in FIG. 6B, two or more circuit blocks are disposed along the direction D2. Therefore, the width W in the direction D2 is equal to or greater than "W1+2×WB+W2". In the embodiment, the output-side I/F region 12 is disposed on the side of the data driver block DB (or the memory block) in the direction D2 without another circuit block interposed therebetween. Specifically, the data driver block DB and the output-side I/F region 12 are disposed adjacent to each other. The input-side I/F region 14 is disposed on the side of the data driver block DB (or the memory block) in the direction D4 without another circuit block interposed therebetween. Specifically, the data driver block DB and the input-side I/F region 14 are disposed adjacent to each other. In this case, another circuit block refers to a major macro circuit block (e.g. grayscale voltage generation circuit block, power supply circuit block, memory block, or logic circuit block) which makes up the display driver, for example.

In the comparative example shown in FIGS. 1A and 6B, since the width W is equal to or greater than "W1+2×WB+W2", the width W of the integrated circuit device 500 in the direction D2 (short side direction) is increased, whereby a slim chip cannot be realized. Therefore, even if the chip is shrunk by using a microfabrication technology, the length LD in the direction D1 (long side direction) is decreased, as shown in FIG. 2A, so that the output pitch becomes narrow, whereby it becomes difficult to mount the integrated circuit device 500.

In the embodiment, since another circuit block does not exist between the data driver block DB and the I/F regions 12 and 14, "W<W1+2×WB+W2" is satisfied. Therefore, since the width W of the integrated circuit device in the direction D2 can be reduced, a slim chip as shown in FIG. 2B can be realized. In more detail, the width W in the direction D2 (short side direction) may be set at "W<2 mm". More specifically, the width W in the direction D2 may be set at "W<1.5 mm". It is preferable that "W>0.9 mm" taking inspection and mounting of the chip into consideration. The length LD in the long side direction may be set at "15 mm<LD<27 mm". The chip shape ratio SP=LD/W may be set at "SP>10" as described above, and still more preferably set at "SP>12". This realizes a slim integrated circuit device in which W=1.3 mm, LD=22 mm, and SP=16.9 or W=1.35 mm, LD=17 mm, and SP=12.6 corresponding to the specification such as the number of pins, for example. As a result, mounting can be facilitated as shown in FIG. 2B. Moreover, cost can be reduced due to a decrease in the chip area. Specifically, facilitation of mounting and a reduction in cost can be achieved in combination.

The widths W1, WB, and W2 shown in FIG. 18B indicate the widths of transistor formation regions (bulk regions or active regions) of the output-side I/F region 12, the circuit blocks CB1 to CBN, and the input-side I/F region 14, respectively. Specifically, output transistors, input transistors, input-output transistors, transistors of electrostatic protection elements, and the like are formed in the I/F regions 12 and 14. Transistors which make up the circuits are formed in the circuit blocks CB1 to CBN. The widths W1, WB, and W2 are determined based on well regions and diffusion regions in which the transistors are formed. In order to realize a slimer integrated circuit device, it is preferable to form bumps (active surface bumps) on the transistors of the circuit blocks CB1 to CBN. In more detail, a resin core bump, in which the core is formed of a resin and a metal layer is formed on the surface of the resin, is formed on the transistor (active region). The bumps (external connection terminals) are connected with the pads disposed in the I/F regions 12 and 14 through metal interconnects. The widths W1, WB, and W2 of the embodiment are not the widths of the bump formation regions, but the widths of the transistor formation regions formed under the bumps.

The widths of the circuit blocks CB1 to CBN in the direction D2 may be identical, for example. In this case, it suffices that the width of each circuit block be substantially identical, and the width of each circuit block may differ in the range of several to 20 μm (several tens of microns), for example. When a circuit block with a different width exists in the circuit blocks CB1 to CBN, the width WB may be the maximum width of the circuit blocks CB1 to CBN. In this case, the maximum width may be the width of the data driver block in the direction D2, for example. In the case where the integrated circuit device includes a memory, the maximum width may be the width of the memory block in the direction D2. A vacant region having a width of about 20 to 30 μm may be provided between the circuit blocks CB1 to CBN and the I/F regions 12 and 14, for example.

The relationship among the widths W1, WB, and W2 is described below. In the embodiment, the width W1 of the output-side I/F region 12 in the direction D2 may be set at "0.13 mm≦W1≦0.4 mm", as shown in FIG. 18C. The width WB of the circuit blocks CB1 to CBN may be set at "0.65 mm≦WB≦1.2 mm". The width W2 of the input-side I/F region 14 may be set at "0.1 mm≦W2≦0.2 mm".

In the output-side I/F region 12, a pad is disposed of which the number of stages in the direction D2 is one or more, for example. The width W1 of the output-side I/F region 12 is minimized by disposing output transistors, transistors for electrostatic protection elements, and the like under the pads as shown in FIG. 6A. Therefore, the width W1 is "0.13 mm≦W1≦0.4 mm" taking the pad width (e.g. 0.1 mm) and the pad pitch into consideration.

In the input-side I/F region 14, a pad is disposed of which the number of stages in the direction D2 is one. The width W2 of the input-side I/F region 14 is minimized by disposing input transistors, transistors for electrostatic protection elements, and the like under the pads as shown in FIG. 6A. Therefore, the width W2 is "0.1 mm≦W2≦0.2 mm" taking the pad width and the pad pitch into consideration. The number of stages of the pad in the direction D2 is set at one or more in the output-side I/F region 12 because the number (or size) of transistors which must be disposed under the pads is greater in the output-side I/F region 12 than in the input-side I/F region 14.

The width WB of the circuit blocks CB1 to CBN is determined based on the width of the data driver block DB or the memory block MB in the direction D2. In order to realize a slim integrated circuit device, interconnects for the logic signal from the logic circuit block, the grayscale voltage signal from the grayscale voltage generation circuit block, and the power supply must be formed on the circuit blocks CB1 to CBN by using global lines. The total width of these interconnects is about 0.8 to 0.9 mm, for example. Therefore, the width WB of the circuit blocks CB1 to CBN is "0.65 mm≦WB≦1.2 mm" taking the total width of the interconnects into consideration.

Since "0.65 mm≦WB≦1.2 mm" is satisfied, WB>W1+W2 is satisfied even if W1=0.4 mm and W2=0.2 mm. When the widths W1, WB, and W2 are the minimum values (W1=0.13 mm, WB=0.65 mm, and W2=0.1 m), the width W of the integrated circuit device is about 0.88 mm. Therefore, "W=0.88 mm<2×WB=1.3 mm" is satisfied. When the widths W1, WB, and W2 are the maximum values (W1=0.4 mm, WB=1.2 mm, and W2=0.2 mm), the width W of the integrated circuit device is about 1.8 mm. Therefore, "W=1.8 mm<2×WB=2.4 mm" is satisfied. Specifically, "W<2×WB" is satisfied. If "W<2×WB" is satisfied, a slim integrated circuit device as shown in FIG. 2B can be realized.

5. Details of Memory Block and Data Driver Block

5.1 Block Division

Figure 19A:
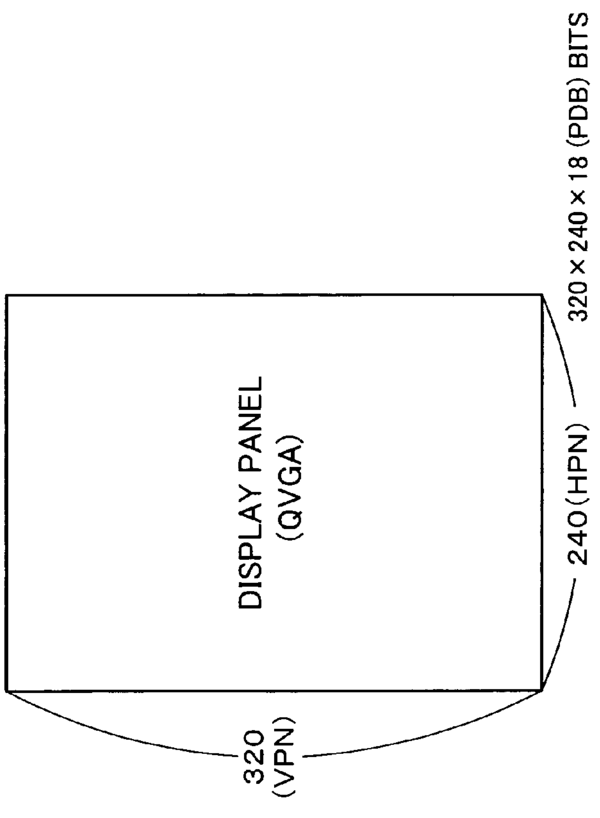
FIGS. 19A and 19B are diagrams illustrative of arrangement of a memory block and a data driver block.

Suppose that the display panel is a QVGA panel in which the number of pixels VPN in the vertical scan direction (data line direction) is 320 and the number of pixels HPN in the horizontal scan direction (scan line direction) is 240, as shown in FIG. 19A. Suppose that the number of bits PDB of image (display) data for one pixel is 18 bits (six bits each for R, G, and B). In this case, the number of bits of image data necessary for displaying one frame of the display panel is "VPN×HPN×PDB=320×240×18" bits. Therefore, the memory of the integrated circuit device stores at least "320×240×18" bits of image data. The data driver outputs data signals for HPN=240 data lines (data signals corresponding to 240×18 bits of image data) to the display panel in one horizontal scan period (period in which one scan line is scanned).

Figure 19B:
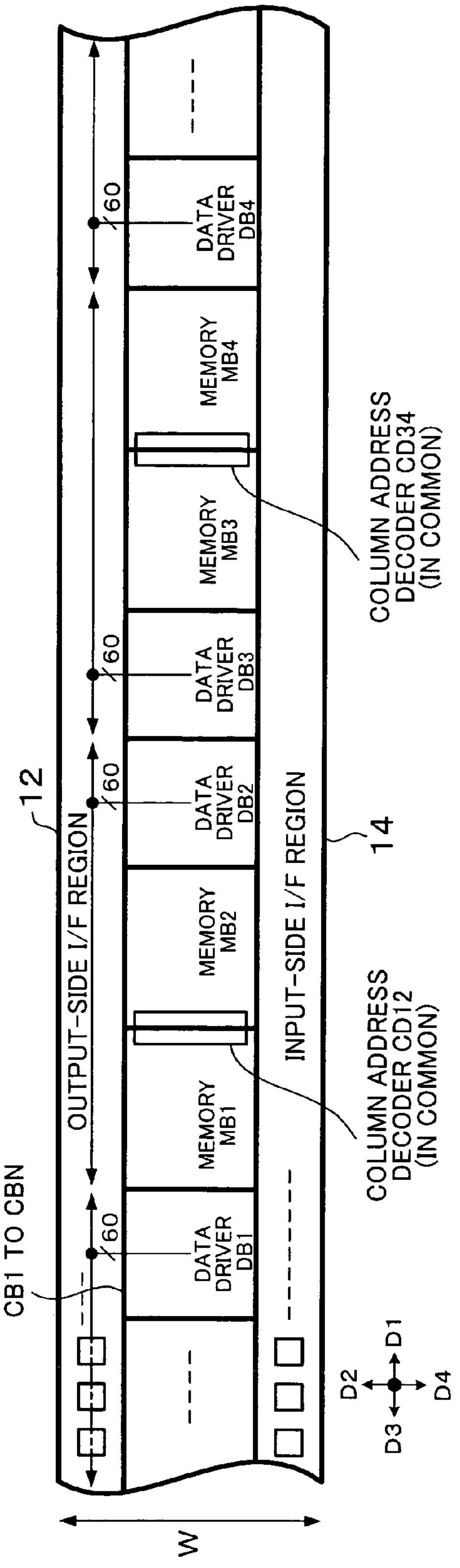

In FIG. 19B, the data driver is divided into four (DBN=4) data driver blocks DB1 to DB4. The memory is also divided into four (MBN=DBN=4) memory blocks MB1 to MB4. Therefore, each of the data driver blocks DB1 to DB4 outputs data signals for 60 (HPN/DBN=240/4=60) data lines to the display panel in units of horizontal scan periods. Each of the memory blocks MB1 to MB4 stores image data for "(VPN×HPN×PDB)/MBN=(320×240×18)/4" bits. In FIG. 19B, a column address decoder CD12 is used in common by the memory blocks MB1 and MB2, and a column address decoder CD34 is used in common by the memory blocks MB3 and MB4.

5.2 A plurality of Readings in One Horizontal Scan Period

In FIG. 19B, each of the data driver blocks DB1 to DB4 outputs data signals for 60 data lines in one horizontal scan period. Therefore, image data corresponding to the data signals for 240 data lines must be read from the data driver blocks DB1 to DB4 corresponding to the data driver blocks DB1 to DB4 in one horizontal scan period.

However, when the number of bits of image data read in one horizontal scan period is increased, it is necessary to increase the number of memory cells (sense amplifiers) arranged in the direction D2. As a result, since the width W of the integrated circuit device in the direction D2 is increased, the width of the chip cannot be reduced. Moreover, since the length of the wordline WL is increased, a signal delay problem in the wordline WL occurs.

In the embodiment, the image data stored in the memory blocks MB1 to MB4 is read from the memory blocks MB1 to MB4 into the data driver blocks DB1 to DB4 a plurality of times (RN times) in one horizontal scan period.

Figure 20:
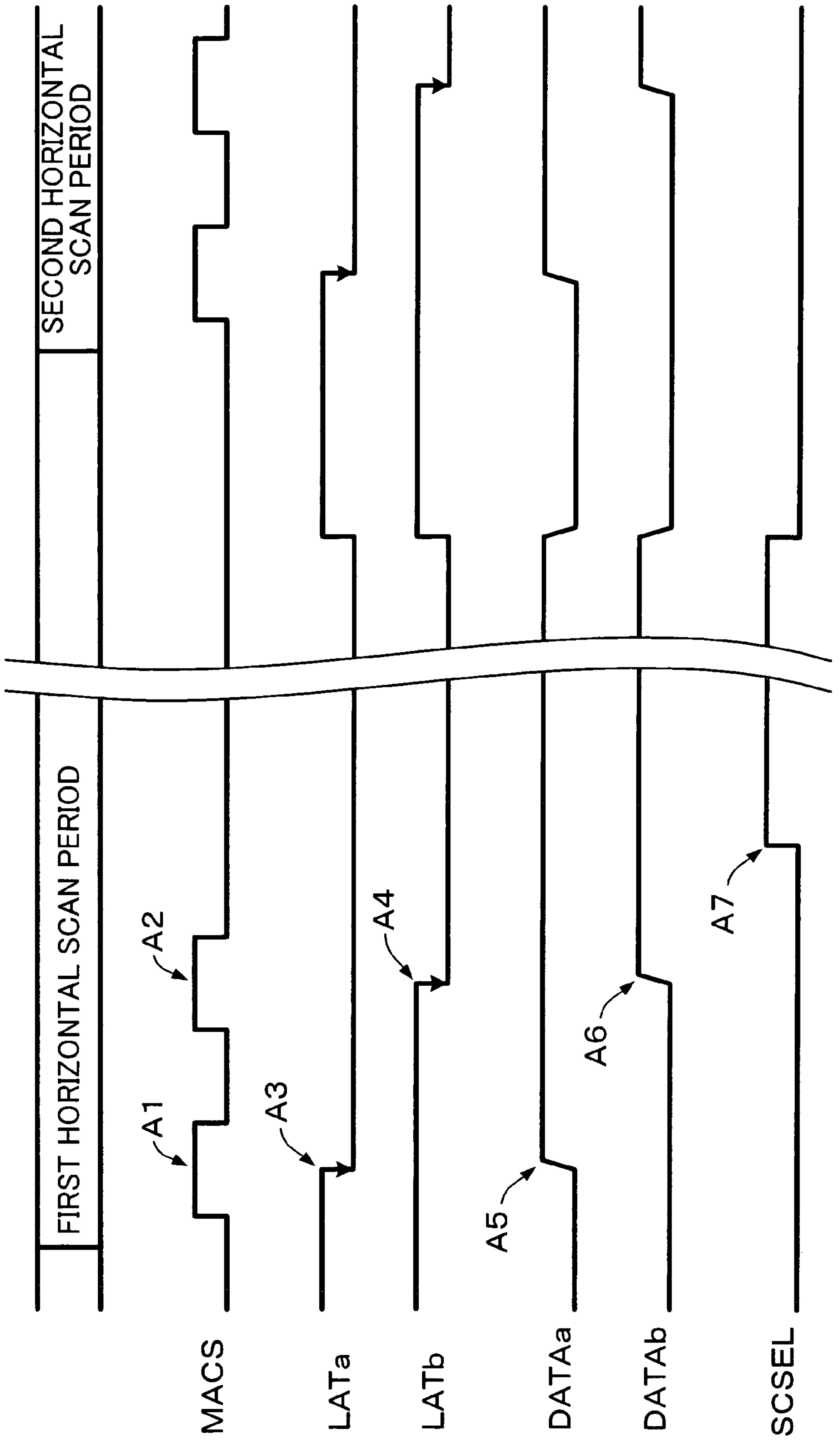
FIG. 20 is a diagram illustrative of a method of reading image data a plurality of times in one horizontal scan period.
Figure 21:
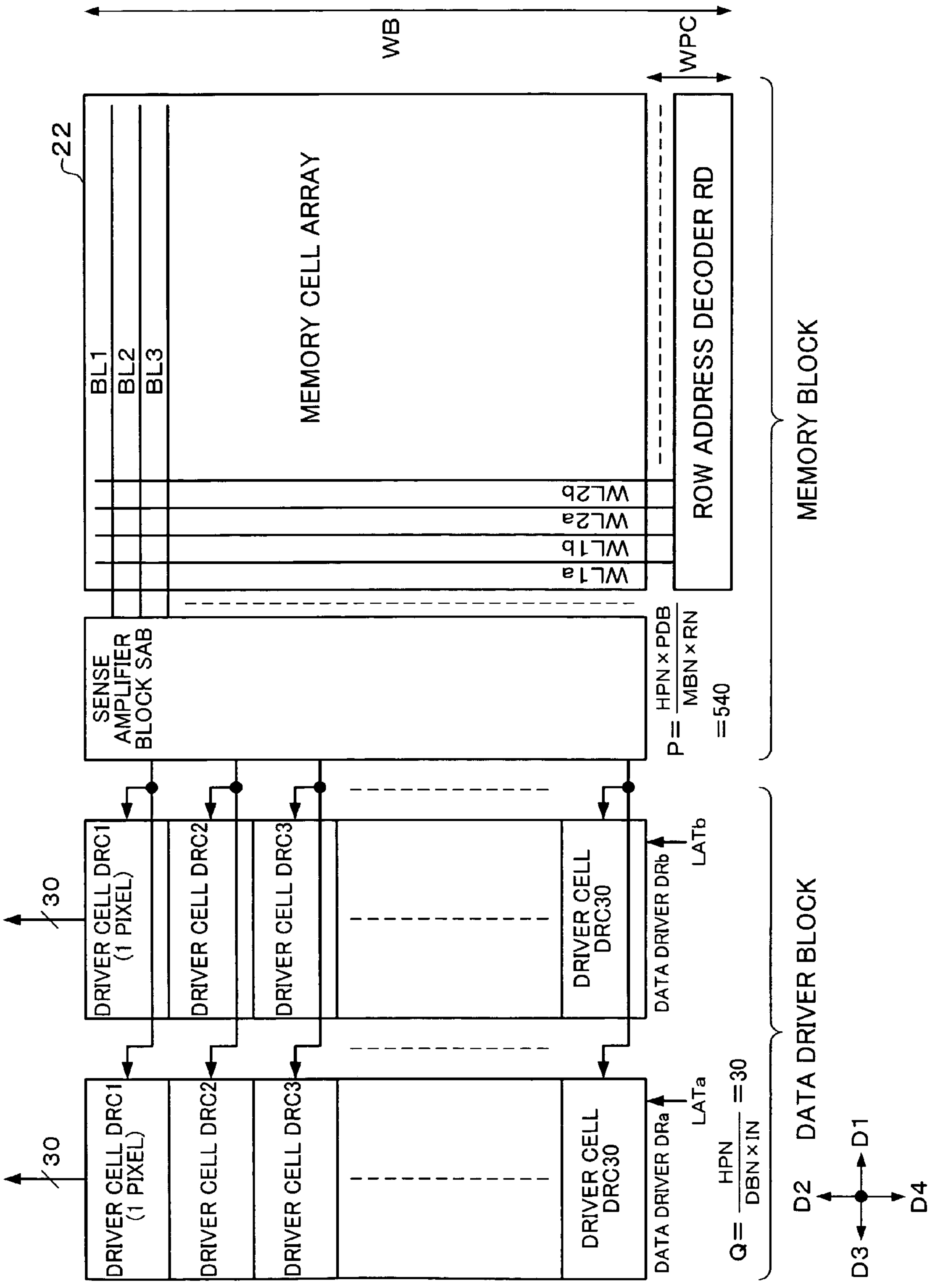
FIG. 21 is an arrangement example of a data driver and a driver cell.

In FIG. 20, a memory access signal MACS (word select signal) goes active (high level) twice (RN=2) in one horizontal scan period as indicated by A1 and A2, for example. This causes the image data to be read from each memory block into each data driver block twice (RN=2) in one horizontal scan period. Then, data latch circuits included in data drivers DRa and DRb shown in FIG. 21 provided in the data driver block latch the read image data based on latch signals LATa and LATb indicated by A3 and A4. D/A conversion circuits included in the data drivers DRa and DRb perform D/A conversion of the latched image data, and output circuits included in the data drivers DRa and DRb output data signals DATAa and DATAb obtained by D/A conversion to the data signal output line as indicated by A5 and A6. A scan signal SCSEL input to the gate of the TFT of each pixel of the display panel goes active as indicated by A7, and the data signal is input to and held by each pixel of the display panel.

In FIG. 20, the image data is read twice in the first horizontal scan period, and the data signals DATAa and DATAb are output to the data signal output line in the first horizontal scan period. However, the image data may be read twice and latched in the first horizontal scan period, and the data signals DATAa and DATAb corresponding to the latched image data may be output to the data signal output line in the second horizontal scan period. FIG. 20 shows the case where the number of readings RN is 2. However, the number of readings RN may be three or more (RN≧3).

According to the method shown in FIG. 20, the image data corresponding to the data signals for 30 data lines is read from each memory block, and each of the data drivers DRa and DRb outputs the data signals for 30 data lines, as shown in FIG. 21. Therefore, the data signals for 60 data lines are output from each data driver block. As described above, it suffices to read the image data corresponding to the data signals for 30 data lines from each memory block in one read operation in FIG. 20. Therefore, the number of memory cells and sense amplifiers in the direction D2 in FIG. 21 can be reduced in comparison with the method of reading the image data only once in one horizontal scan period. As a result, since the width W of the integrated circuit device in the direction D2 can be reduced, a very slim chip as shown in FIG. 2B can be realized. The length of one horizontal scan period is about 52 microseconds in the case of a QVGA display. On the other hand, the memory read time is about 40 nsec, for example, which is sufficiently shorter than 52 microseconds. Therefore, even if the number of readings in one horizontal scan period is increased from once to several times, the display characteristics are not affected to a large extent.

FIG. 19A shows an example of a QVGA (320×240) display panel. However, it is possible to deal with a VGA (640×480) display panel by increasing the number of readings RN in one horizontal scan period to four (RN=4), for example, whereby the degrees of freedom of the design can be increased.

A plurality of readings in one horizontal scan period may be realized by a first method in which the row address decoder (wordline select circuit) selects different wordlines in each memory block in one horizontal scan period, or a second method in which the row address decoder (wordline select circuit) selects a single wordline in each memory block a plurality of times in one horizontal scan period. Or, a plurality of readings in one horizontal scan period may be realized by combining the first method and the second method.

5.3 Arrangement of Data Driver and Driver Cell

FIG. 21 shows an arrangement example of data drivers and driver cells included in the data drivers. As shown in FIG. 21, the data driver block includes a plurality of data drivers DRa and DRb (first to mth data drivers) disposed along the direction D1. Each of the data drivers DRa and DRb includes 30 (Q in a broad sense) driver cells DRC1 to DRC30.

When a wordline WL1*a* of the memory block is selected and the first image data is read from the memory block as indicated by A1 shown in FIG. 20, the data driver DRa latches the read image data based on the latch signal LATa indicated by A3. The data driver DRa performs D/A conversion of the latched image data, and outputs the data signal DATAa corresponding to the first read image data to the data signal output line as indicated by A5.

When a wordline WL1*b* of the memory block is selected and the second image data is read from the memory block as indicated by A2 shown in FIG. 20, the data driver DRb latches the read image data based on the latch signal LATb indicated by A4. The data driver DRb performs D/A conversion of the latched image data, and outputs the data signal DATAb corresponding to the second read image data to the data signal output line as indicated by A6.

As described above, each of the data drivers DRa and DRb outputs the data signals for 30 data lines corresponding to 30 pixels so that the data signals for 60 data lines corresponding to 60 pixels are output in total.

A problem in which the width W of the integrated circuit device in the direction D2 is increased due to an increase in the scale of the data driver can be prevented by disposing (stacking) the data drivers DRa and DRb along the direction D1 as shown in FIG. 21. The data driver is configured in various ways depending on the type of display panel. In this case, the data drivers having various configurations can be efficiently disposed by disposing the data drivers along the direction D1. FIG. 21 shows the case where the number of data drivers disposed in the direction D1 is two. However, the number of data drivers disposed in the direction D1 may be three or more.

In FIG. 21, each of the data drivers DRa and DRb includes 30 (Q) driver cells DRC1 to DRC30 disposed along the direction D2. Each of the driver cells DRC1 to DRC30 receives image data for one pixel. Each of the driver cells DRC1 to DRC30 performs D/A conversion of the image data for one pixel, and outputs a data signal corresponding to the image data for one pixel. Each of the driver cells DRC1 to DRC30 may include a data latch circuit, the DAC (DAC for one pixel) shown in FIG. 10A, and the output section SQ shown in FIGS. 10B and 10C.

In FIG. 21, suppose that the number of pixels of the display panel in the horizontal scan direction (the number of pixels in the horizontal scan direction driven by each integrated circuit device when a plurality of integrated circuit devices cooperate to drive the data lines of the display panel) is HPN, the number of data driver blocks (number of block divisions) is DBN, and the number of inputs of image data to the driver cell in one horizontal scan period is IN. The number of inputs IN is equal to the number of readings RN of image data in one horizontal scan period described with reference to FIG. 20. In this case, the number of driver cells DRC1 to DRC30 disposed along the direction D2 may be expressed as "Q=HPN/(DBN×IN)". In FIG. 21, since HPN=240, DBN=4, and IN=2, Q is 30 (240/(4×2)).

When the width (pitch) of the driver cells DRC1 to DR30 in the direction D2 is WD, the width WB (maximum width) of the first to Nth circuit blocks CB1 to CBN in the direction D2 may be expressed as "Q×WD≦WB<(Q+1)×WD". When the width of the peripheral circuit section (e.g. row address decoder RD and interconnect region) included in the memory block in the direction D2 is WPC, "Q×WD≦WB<(Q+1)×WD+WPC" is satisfied.

Suppose that the number of pixels of the display panel in the horizontal scan direction is HPN, the number of bits of image data for one pixel is PDB, the number of memory blocks is MBN (=DBN), and the number of readings of image data from the memory block in one horizontal scan period is RN. In this case, the number (P) of sense amplifiers (sense amplifiers which output one bit of image data) arranged in a sense amplifier block SAB along the direction D2 may be expressed as "P=(HPN×PDB)/(MBN×RN)". In FIG. 21, since HPN=240, PDB=18, MBN=4, and RN=2, P is 540 ((240×18)/(4×2)). The number P is the number of effective sense amplifiers corresponding to the number of effective memory cells, and excludes the number of ineffective sense amplifiers for dummy memory cells and the like.

When the width (pitch) of each sense amplifier included in the sense amplifier block SAB in the direction D2 is WS, the width WSAB of the sense amplifier block SAB (memory block) in the direction D2 may be expressed as "WSAB=P×WS". When the width of the peripheral circuit section included in the memory block in the direction D2 is WPC, the width WB (maximum width) of the circuit blocks CB1 to CBN in the direction D2 may also be expressed as "P×WS≦WB<(P+PDB)×WS+WPC".

5.4 Memory Cell

Figure 22A:
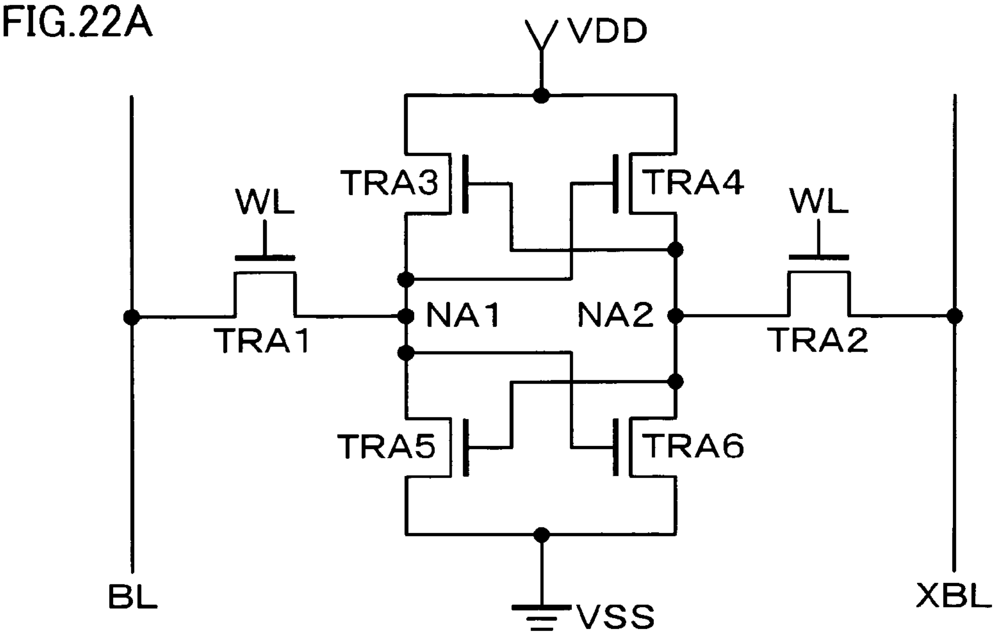
FIGS. 22A to 22C are configuration examples of a memory cell.

FIG. 22A shows a configuration example of the memory cell (SRAM) included in the memory block. The memory cell includes transfer transistors TRA1 and TRA2, load transistors TRA3 and TRA4, and driver transistors TRA5 and TRA6. The transfer transistors TRA1 and TRA2 are turned ON when the wordline WL goes active, so that image data can be written into nodes NA1 and NA2 or read from the nodes NA1 and NA2. The image data written into the memory cell is held at the nodes NA1 and NA2 by using flip-flop circuits formed by the transistors TRA3 to TRA6. The configuration of the memory cell of the embodiment is not limited to the configuration shown in FIG. 22A. Various modifications and variations may be made, such as using resistor elements as the load transistors TRA3 and TRA4 or adding other transistors.

Figure 22B:
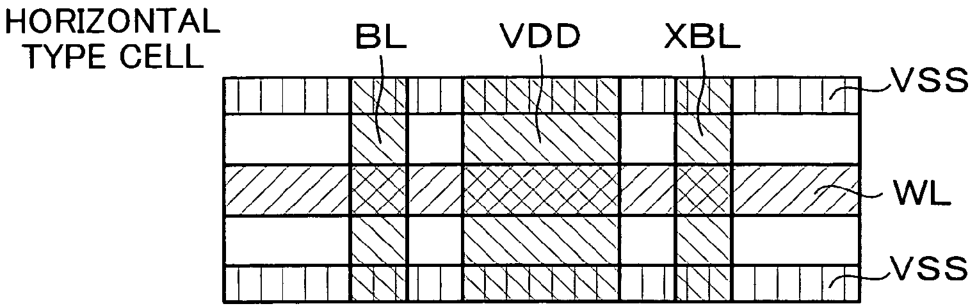
Figure 22C:
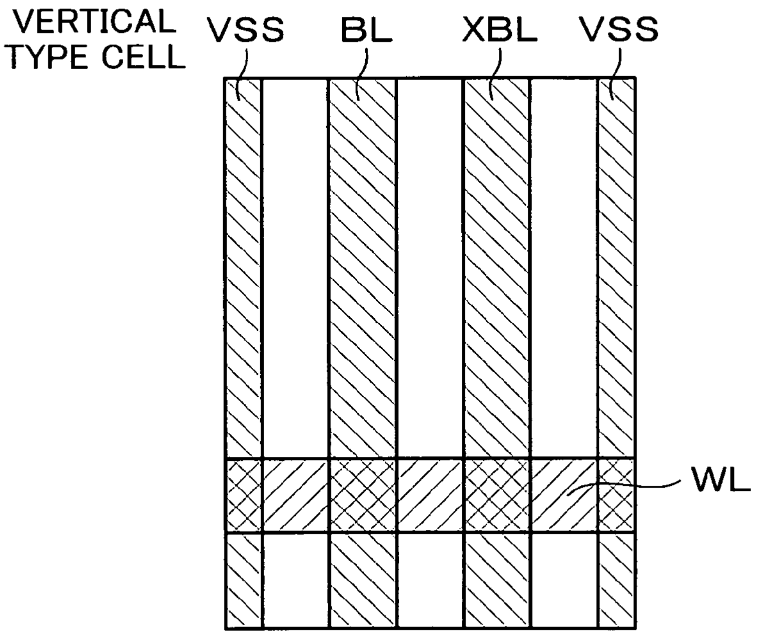

FIGS. 22B and 22C show layout examples of the memory cell. FIG. 22B shows a layout example of a horizontal type cell, and FIG. 22C shows a layout example of a vertical type cell. As shown in FIG. 22B, the horizontal type cell is a cell in which the wordline WL is longer than the bitlines BL and XBL in each memory cell. As shown in FIG. 22C, the vertical type cell is a cell in which the bitlines BL and XBL are longer than the wordline WL in each memory cell. The wordline WL shown in FIG. 22C is a local wordline which is formed by a polysilicon layer and connected with the transfer transistors TRA1 and TRA2. However, a wordline formed by a metal layer may be further provided to prevent a signal delay in the wordline WL and to stabilize the potential of the wordline WL.

Figure 23:
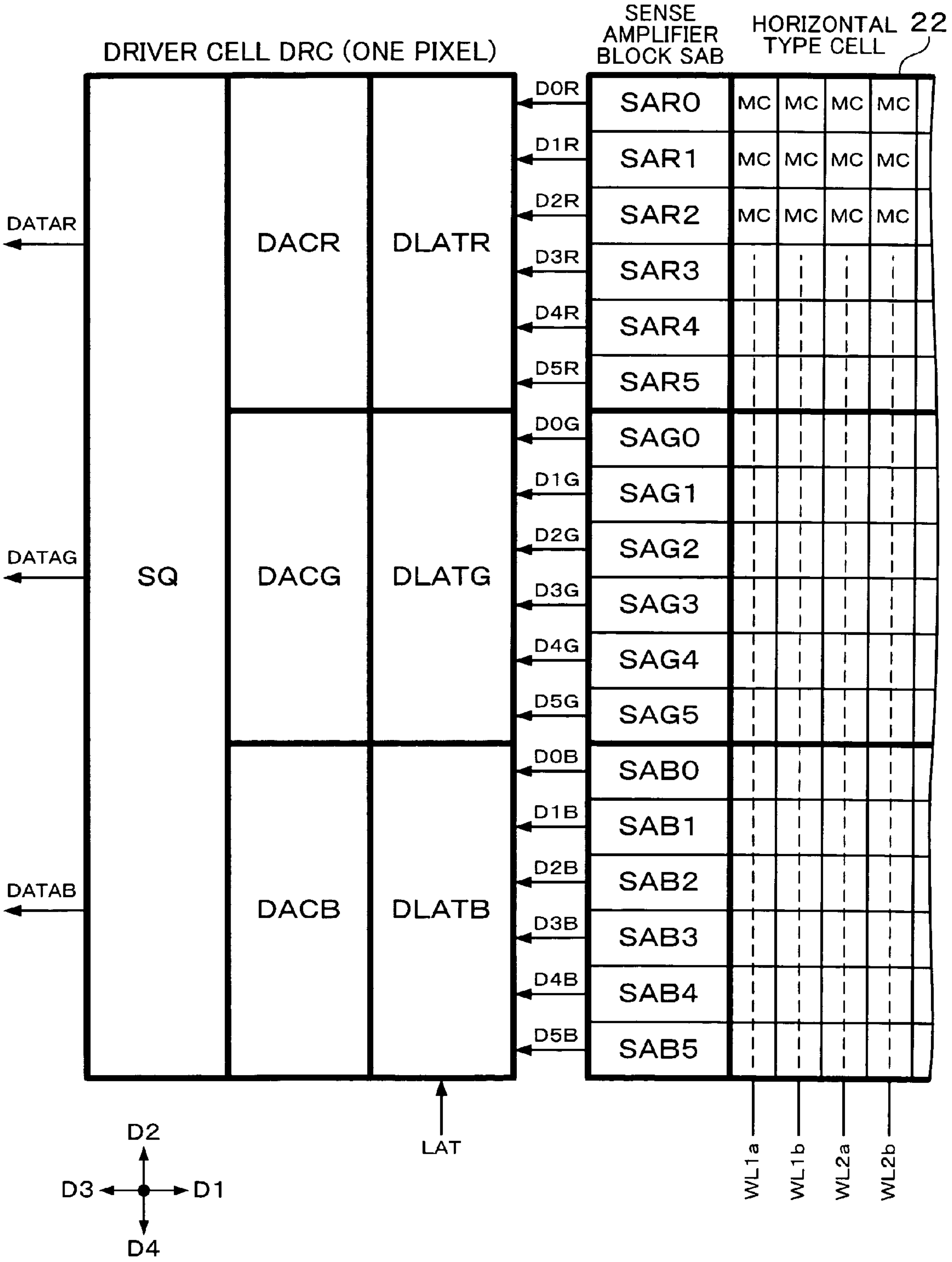
FIG. 23 is an arrangement example of the memory block and the driver cell when using a horizontal type cell.

FIG. 23 shows an arrangement example of the memory block and the driver cell when using the horizontal type cell shown in FIG. 22B as the memory cell. FIG. 23 shows a section of the driver cell and the memory block corresponding to one pixel in detail.

As shown in FIG. 23, the driver cell DRC which receives image data for one pixel includes R (red), G (green), and B (blue) data latch circuits DLATR, DLATG, and DLATB. Each of the data latch circuits DLATR, DLATG, and DLATB latches image data when the latch signal LAT (LATa, LATb)

goes active. The driver cell DRC includes the R, G, and B digital-analog converters DACR, DACG, and DACB described with reference to FIG. 10A. The driver cell DRC also includes the output section SQ described with reference to FIGS. 10B and 10C.

A section of the sense amplifier block SAB corresponding to one pixel includes R sense amplifiers SAR0 to SAR5, G sense amplifiers SAG0 to SAG5, and B sense amplifiers SAB0 to SAB5. The bitlines BL and XBL of the memory cells MC arranged along the direction D1 on the D1 side of the sense amplifier SAR0 are connected with the sense amplifier SAR0. The bitlines BL and XBL of the memory cells MC arranged along the direction D1 on the D1 side of the sense amplifier SAR1 are connected with the sense amplifier SAR1. The above description also applies to the relationship between the remaining sense amplifiers and the memory cells.

When the wordline WL1*a* is selected, image data is read from the memory cells MC of which the gate of the transfer transistor is connected with the wordline WL1*a* through the bitlines BL and XBL, and the sense amplifiers SAR0 to SAR5, SAG0 to SAG5, and SAB0 to SAB5 perform the signal amplification operation. The data latch circuit DLATR latches 6-bit R image data D0R to D5R from the sense amplifiers SAR0 to SAR5, the digital-analog converter DACR performs D/A conversion of the latched image data, and the output section SQ outputs the data signal DATAR. The data latch circuit DLATG latches 6-bit G image data D0G to D5G from the sense amplifiers SAG0 to SAG5, the digital-analog converter DACG performs D/A conversion of the latched image data, and the output section SQ outputs the data signal DATAG. The data latch circuit DLATB latches 6-bit G image data D0B to D5B from the sense amplifiers SAB0 to SAB5, the digital-analog converter DACB performs D/A conversion of the latched image data, and the output section SQ outputs the data signal DATAB.

In the configuration shown in FIG. 23, the image data can be read a plurality of times in one horizontal scan period shown in FIG. 20 as described below. Specifically, in the first horizontal scan period (first scan line select period), the first image data is read by selecting the wordline WL1*a*, and the first data signal DATAa is output as indicated by A5 shown in FIG. 20. In the first horizontal scan period, the second image data is read by selecting the wordline WL1*b*, and the second data signal DATAb is output as indicated by A6 shown in FIG. 20. In the second horizontal scan period (second scan line select period), the first image data is read by selecting the wordline WL2*a*, and the first data signal DATAa is output. In the second horizontal scan period, the second image data is read by selecting the wordline WL2*b*, and the second data signal DATAb is output. When using the horizontal type cell, the image data can be read a plurality of times in one horizontal scan period by selecting different wordlines (WL1*a* and WL1*b*) in the memory block in one horizontal scan period.

Figure 24:
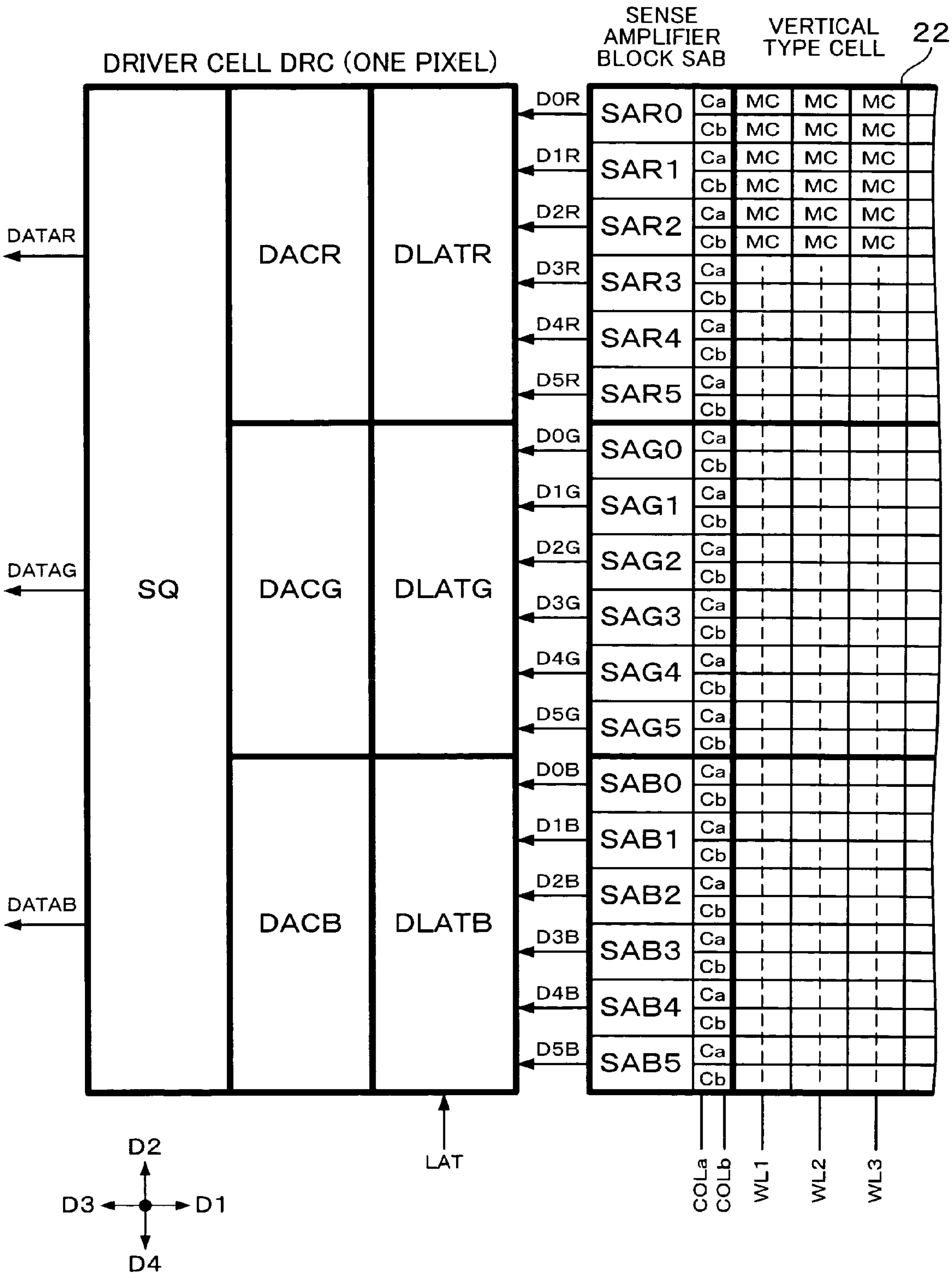
FIG. 24 is an arrangement example of the memory block and the driver cell when using a vertical type cell.

FIG. 24 shows an arrangement example of the memory block and the driver cell when using the vertical type cell shown in FIG. 22C as the memory cell. The width of the vertical type cell in the direction D2 can be reduced in comparison with the horizontal type cell. Therefore, the number of memory cells in the direction D2 can be doubled in comparison with the horizontal type cell. When using the vertical type cell, the column of the memory cells connected with each sense amplifier is switched by using column select signals COLa and COLb.

In FIG. 24, when the column select signal COLa goes active, the column Ca side memory cells MC provided on the D1 side of the sense amplifiers SAR0 to SAR5 are selected and connected with the sense amplifiers SAR0 to SAR5, for example. The signals of the image data stored in the selected memory cells MC are amplified and output as the image data D0R to D5R. When the column select signal COLb goes active, the column Cb side memory cells MC provided on the D1 side of the sense amplifiers SAR0 to SAR5 are selected and connected with the sense amplifiers SAR0 to SAR5. The signals of the image data stored in the selected memory cells MC are amplified and output as the image data D0R to D5R. The above description also applies to the read operation of image data from the memory cells connected with the remaining sense amplifiers.

In the configuration shown in FIG. 24, the image data can be read a plurality of times in one horizontal scan period shown in FIG. 20 as described below. Specifically, in the first horizontal scan period, the first image data is read by selecting the wordline WL1 and setting the column select signal COLa to active, and the first data signal DATAa is output as indicated by A5 shown in FIG. 20. In the first horizontal scan period, the second image data is read by again selecting the wordline WL1 and setting the column select signal COLb to active, and the second data signal DATAb is output as indicated by A6 shown in FIG. 20. In the second horizontal scan period, the first image data is read by selecting the wordline WL2 and setting the column select signal COLa to active, and the first data signal DATAa is output. In the second horizontal scan period, the second image data is read by again selecting the wordline WL2 and setting the column select signal COLb to active, and the second data signal DATAb is output. When using the vertical type cell, the image data can be read a plurality of times in one horizontal scan period by selecting a single wordline in the memory block a plurality of times in one horizontal scan period.

The configuration and the arrangement of the driver cell DRC are not limited to those shown in FIGS. 23 and 24. Various modifications and variations may be made. For example, when a low-temperature polysilicon TFT display driver or the like multiplexes and supplies R, G, and B data signals to the display panel as shown in FIG. 10C, R, G, and B image data (image data for one pixel) may be D/A converted by using one common DAC. In this case, it suffices that the driver cell DRC include one common DAC having the configuration shown in FIG. 10A. In FIGS. 23 and 24, the R circuits (DLATR and DACR), the G circuits (DLATG and DACG), and the B circuits (DLATB and DACB) are disposed along the direction D2 (D4). However, the R, G, and B circuits may be disposed along the direction D1 (D3).

6. Electronic Instrument

Figure 25A:
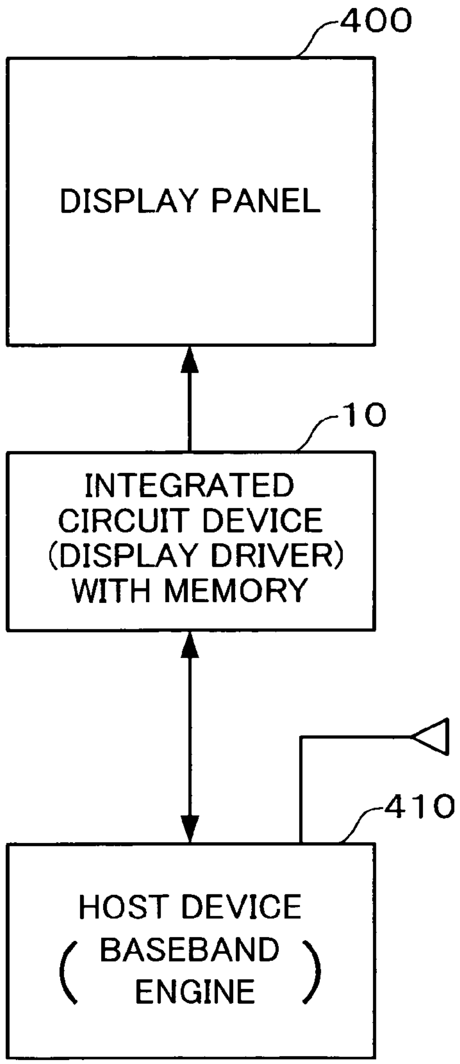
FIGS. 25A and 25B are configuration examples of an electronic instrument according to one embodiment of the invention.
Figure 25B:
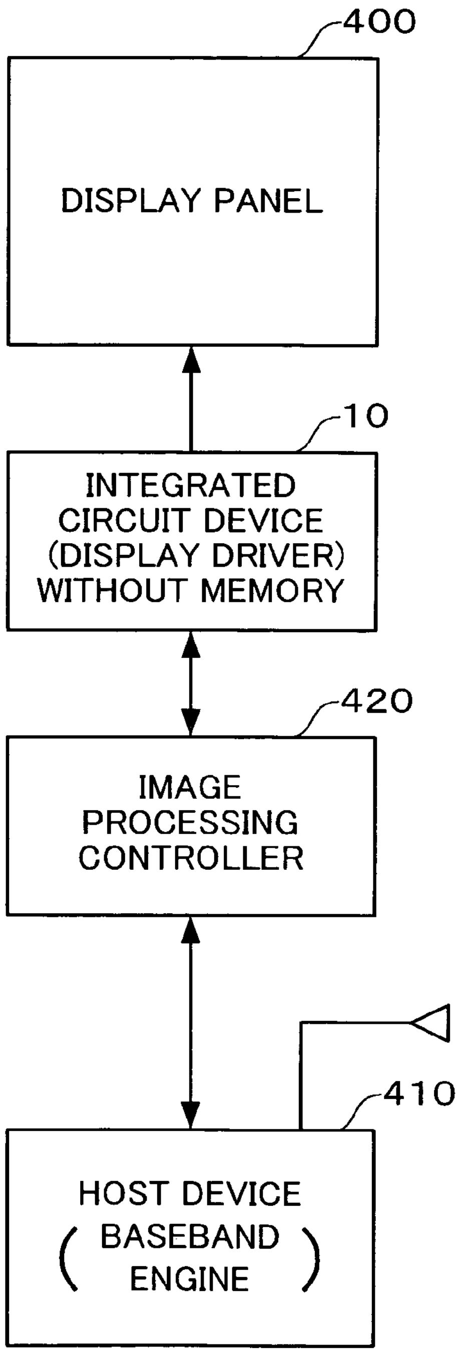

FIGS. 25A and 25B show examples of an electronic instrument (electro-optical device) including the integrated circuit device 10 of the embodiment. The electronic instrument may include constituent elements (e.g. camera, operation section, or power supply) other than the constituent elements shown in FIGS. 25A and 25B. The electronic instrument of the embodiment is not limited to a portable telephone, and may be a digital camera, PDA, electronic notebook, electronic dictionary, projector, rear-projection television, portable information terminal, or the like.

In FIGS. 25A and 25B, a host device 410 is a microprocessor unit (MPU), a baseband engine (baseband processor), or the like. The host device 410 controls the integrated circuit device 10 as a display driver. The host device 410 may perform processing as an application engine and a baseband engine or processing as a graphic engine such as compression, decompression, or sizing. An image processing controller (display controller) 420 shown in FIG. 25B performs processing as a graphic engine such as compression, decompression, or sizing instead of the host device 410.

A display panel 400 includes a plurality of data lines (source lines), a plurality of scan lines (gate lines), and a plurality of pixels specified by the data lines and the scan lines. A display operation is realized by changing the optical properties of an electro-optical element (liquid crystal element in a narrow sense) in each pixel region. The display panel 400 may be formed by an active matrix type panel using switch elements such as a TFT or TFD. The display panel 400 may be a panel other than an active matrix type panel, or may be a panel other than a liquid crystal panel.

In FIG. 25A, the integrated circuit device 10 may include a memory. In this case, the integrated circuit device 10 writes image data from the host device 410 into the built-in memory, and reads the written image data from the built-in memory to drive the display panel. In FIG. 25B, the integrated circuit device 10 may not include a memory. In this case, image data from the host device 410 is written into a memory provided in the image processing controller 420. The integrated circuit device 10 drives the display panel 400 under control of the image processing controller 420.

Although only some embodiments of the invention have been described in detail above, those skilled in the art will readily appreciate that many modifications are possible in the embodiments without departing from the novel teachings and advantages of this invention. Accordingly, all such modifications are intended to be included within the scope of this invention. For example, any term (such as the output-side I/F region and the input-side I/F region) cited with a different term having broader or the same meaning (such as the first interface region and the second interface region) at least once in this specification or drawings can be replaced by the different term in any place in this specification and drawings. The configuration, arrangement, and operation of the integrated circuit device and the electronic instrument are not limited to those described in the embodiment. Various modifications and variations may be made.

What is claimed is:

1. An integrated circuit device, comprising:

first to Nth circuit blocks (N is an integer larger than one) disposed along a first direction, when the first direction is a direction from a first side of the integrated circuit device toward a third side that is opposite to the first side, the first side being a short side, and when a second direction is a direction from a second side of the integrated circuit device toward a fourth side which is opposite to the second side, the second side being a long side, the first to Nth circuit blocks including a high-speed interface circuit block which transfers data through a serial bus using differential signals, and a circuit block other than the high-speed interface circuit block, and the high-speed interface circuit block being disposed as an Mth circuit block ($2 \leqq M \leqq N-1$) of the first to Nth circuit blocks.

2. The integrated circuit device as defined in claim 1, a value M satisfies $[N/2]-2 \leqq M \leqq [N/2]+3$ ([X] being maximum integer which does not exceed X).

3. The integrated circuit device as defined in claim 1, the Mth circuit block including the high-speed interface circuit block and another circuit block.

4. The integrated circuit device as defined in claim 3, the other circuit block of the Mth circuit block being a logic circuit block which generates a display control signal.

5. The integrated circuit device as defined in claim 4, the first to Nth circuit blocks including a grayscale voltage generation circuit block which generates grayscale voltages; and the Mth circuit block including the logic circuit block and the high-speed interface circuit block is disposed adjacent to the grayscale voltage generation circuit block along the first direction.

6. The integrated circuit device as defined in claim 5, the first to Nth circuit blocks including at least one data driver block which receives the grayscale voltages from the grayscale voltage generation circuit block and drives data lines, and the grayscale voltage generation circuit block being disposed between the Mth circuit block including the logic circuit block and the high-speed interface circuit block, and the data driver block.

7. The integrated circuit device as defined in claim 3, the other circuit block of the Mth circuit block being a grayscale voltage generation circuit block which generates grayscale voltages.

8. The integrated circuit device as defined in claim 7, the first to Nth circuit blocks including a logic circuit block which generates a display control signal and sets grayscale characteristic adjustment data, and the Mth circuit block including the grayscale voltage generation circuit block and the high-speed interface circuit block being disposed adjacent to the logic circuit block along the first direction.

9. The integrated circuit device as defined in claim 8, the first to Nth circuit blocks including at least one data driver block that receives the grayscale voltages from the grayscale voltage generation circuit block and drives data lines, and the Mth circuit block including the grayscale voltage generation circuit block and the high-speed interface circuit block is disposed between the logic circuit block and the data driver block.

10. The integrated circuit device as defined in claim 1, comprising:

a first interface region provided along the fourth side and on the second direction side of the first to Nth circuit blocks; and a second interface region provided along the second side and on a fourth direction side of the first to Nth circuit blocks, the fourth direction being opposite to the second direction.

11. The integrated circuit device as defined in claim 10, the high-speed interface circuit block being disposed adjacently on the second direction side of the second interface region.

12. The integrated circuit device as defined in claim 10, when a width of the integrated circuit device in the second direction is denoted by W and a length of the integrated circuit device in the first direction is denoted by LD, a shape ratio SP of the integrated circuit device satisfies SP=LD/W and SP>10.

13. The integrated circuit device as defined in claim 10, when widths of the first interface region, the first to Nth circuit blocks, and the second interface region in the second direction are respectively denoted by W1, WB, and W2, a width W of the integrated circuit device in the second direction satisfies $W1+WB+W2 \leqq W < W1+2 \times WB+W2$.

14. The integrated circuit device as defined in claim 12, when widths of the first interface region, the first to Nth circuit blocks, and the second interface region in the second direction are respectively denoted by W1, WB, and W2, a width W of the integrated circuit device in the second direction satisfies $W1+WB+W2 \leqq W < W1+2 \times WB+W2$.

15. The integrated circuit device as defined in claim 13, the width W of the integrated circuit device in the second direction satisfies $W < 2 \times WB$.

16. The integrated circuit device as defined in claim 14, the width W of the integrated circuit device in the second direction satisfies $W < 2 \times WB$.

17. An electronic instrument, comprising:

the integrated circuit device as defined in claim 1; and a display panel driven by the integrated circuit device.

18. An electronic instrument, comprising:

the integrated circuit device as defined in claim 3; and a display panel driven by the integrated circuit device.

19. An electronic instrument, comprising:

the integrated circuit device as defined in claim 10; and a display panel driven by the integrated circuit device.

20. An electronic instrument, comprising:

the integrated circuit device as defined in claim 13; and a display panel driven by the integrated circuit device.

* * * * *